(12) United States Patent
Russell et al.

(10) Patent No.: US 8,211,737 B2
(45) Date of Patent: Jul. 3, 2012

(54) METHOD OF PRODUCING NANOPATTERNED ARTICLES, AND ARTICLES PRODUCED THEREBY

(75) Inventors: Thomas P. Russell, Amherst, MA (US); Soojin Park, Amherst, MA (US); Ting Xu, Berkeley, CA (US)

(73) Assignees: The University of Massachusetts, Boston, MA (US); The Regents of the University of California, Oakland, CA (US)

( * ) Notice: Subject to any disclaimer, the term of this patent is extended or adjusted under 35 U.S.C. 154(b) by 442 days.

(21) Appl. No.: 12/553,401

(22) Filed: Sep. 3, 2009

(65) Prior Publication Data

US 2010/0112308 A1 May 6, 2010

Related U.S. Application Data

(60) Provisional application No. 61/098,253, filed on Sep. 19, 2008.

(51) Int. Cl.
*H01L 21/00* (2006.01)

(52) U.S. Cl. .......................... 438/89; 977/700; 977/888

(58) Field of Classification Search .................. 438/486, 438/89, 92, 144–152, 586, 686, 786, 787; 977/700, 888
See application file for complete search history.

(56) References Cited

U.S. PATENT DOCUMENTS

| | | | |
|---|---|---|---|
| 5,079,268 A | 1/1992 | Nelissen et al. | |
| 5,772,905 A | 6/1998 | Chou | |
| 6,635,904 B2 | 10/2003 | Goetz et al. | |
| 6,746,825 B2 * | 6/2004 | Nealey et al. | 430/315 |
| 6,858,521 B2 | 2/2005 | Jin | |
| 6,893,705 B2 * | 5/2005 | Thomas et al. | 428/141 |
| 6,926,953 B2 | 8/2005 | Nealey et al. | |
| 6,943,117 B2 | 9/2005 | Jeong et al. | |
| 7,030,167 B2 | 4/2006 | Gunther | |
| 7,081,269 B2 | 7/2006 | Yang et al. | |
| 7,138,325 B2 | 11/2006 | Maleville et al. | |
| 7,189,435 B2 | 3/2007 | Tuominen et al. | |
| 7,190,049 B2 | 3/2007 | Tuominen et al. | |
| 7,632,544 B2 | 12/2009 | Ho et al. | |
| 2003/0118800 A1 * | 6/2003 | Thomas et al. | 428/215 |
| 2004/0124092 A1 | 7/2004 | Black et al. | |
| 2004/0175628 A1 * | 9/2004 | Nealey et al. | 430/1 |
| 2004/0265548 A1 | 12/2004 | Ho et al. | |

(Continued)

FOREIGN PATENT DOCUMENTS

GB      1294406      10/1972

(Continued)

OTHER PUBLICATIONS

I. A. Ansari, I.W. Hamley, J. Mater. Chem. 2003, 13, 2412.

(Continued)

*Primary Examiner* — Michael Lebentritt
(74) *Attorney, Agent, or Firm* — Cantor Colburn LLP

(57) ABSTRACT

A nanopatterned surface is prepared by forming a block copolymer film on a miscut crystalline substrate, annealing the block copolymer film, then reconstructing the surface of the annealed block copolymer film. The method creates a well-ordered array of voids in the block copolymer film that is maintained over a large area. The nanopatterned block copolymer films can be used in a variety of different applications, including the fabrication of high density data storage media.

29 Claims, 7 Drawing Sheets

U.S. PATENT DOCUMENTS

| | | | |
|---|---|---|---|
| 2005/0014855 A1 | 1/2005 | Bruza et al. | |
| 2006/0231525 A1 | 10/2006 | Asakawa et al. | |
| 2008/0157314 A1 | 7/2008 | Clevenger et al. | |
| 2008/0230514 A1 | 9/2008 | Park et al. | |
| 2010/0075116 A1* | 3/2010 | Russell et al. | 428/195.1 |
| 2010/0086801 A1* | 4/2010 | Russell et al. | 428/551 |

FOREIGN PATENT DOCUMENTS

| | | |
|---|---|---|
| WO | 2007038381 A2 | 4/2007 |

OTHER PUBLICATIONS

C.T. Black, IEEE Transactions on Nanotechnology, 2004, vol. 3, p. 412 ff.

C.T. Black, C.B. Murray, R.L. Sandstrom, S. Sun, Science 2000, 290, 1131.

M.R. Bockstaller, R.A. Mickiewicz, E.L. Thomas, Adv. Mater. 2005, 17, 1331.

J.Y. Cheng, C.A. Ross, E.L. Thomas, H.I. Smith, G. J. Vancso, Appl. Phys. Lett. 2002, 81, 3657.

G. Cheng, M. Moskovits, Adv. Mater. 2002, 14,1567.

J.J. Chiu, B.J. Kim, E.J. Kramer, D.J. Pine, E.J. Kramer, Adv. Mater. 2005, 127, 5036-5037.

S.Y. Chou, P.R. Krauss, W. Zhang, L. Guo, and L. Zhuang, Journal of Vacuum Science and Technology B, 1997, vol. 15, p. 2897 ff.

E. Drockenmuller, L.Y.T. Li, D.Y. Ryu, E. Harth, T.P. Russell, H.C. Kim and C.J. Hawker, Journal of Polymer Science, Part A: Polymer Chemistry, 2005, vol. 43, p. 1028 ff.

H.J. Fan, P. Werner, M. Zacharias, Small 2006, 2, 700.

Fasolka et al., Observed Substrate Topography-Mediated Lateral Patterning of Diblock Copolymer Films, Phys. Rev. Lett., 79, 3018 (1997).

D.L. Feldheim, K.C. Grabar, M.J. Natan, T.E. Mallouk, J. Am. Chem. Soc. 1996, 118, 7640.

J.M. Gibson, Physics Today, 1997, vol. 50, p. 56 ff.

R. Glass, M. M Arnold, E.A. Cavalcanti-Adam, J. Blummer, C. Haferkemper, C. Dodd, and J.P. Spatz, New Journal of Physics, 2004, vol. 6, p. 101 ff.

A. Golzhauser, W. Eck, W. Geyer, V. Stadler, T. Weimann, P. Hinze, and M. Grunze, Advanced Materials, 2001, vol. 13, p. 806 ff.

B. Gorzolnik, P. Mela, M. Moeller, Nanotechnology 2006, 17, 5027.

K.W. Guarini, C.T. Black, Y. Zhang, H. Kim, E.M. Sikorski, I. Babich, V.J. Vac. Sci. Technol. B 2002, 20, 2788.

J. Hahm and S.J. Sibener, Langmuir, 2000, vol. 16, p. 4766 ff.

I.W. Hamley, Agnew. Chem. Int. Ed. 2003, 42, 1692.

A. Haryono, W.H. Binder, Small 2006, 2, 600.

Hawker and Russell, MRS Bulletin, 2005, vol. 30, p. 952 ff.

Heier et al., J. Chem. Phys. 1999, 111, 11101-11110.

R.M. Ho, W.H. Tseng, H.W. Fan, Y.W. Chiang, C.C. Lin, B.T. Ko, and B.H. Huang, Polymer, 2005, vol. 46, p. 9362 ff.

K. Honda, T.N. Rao, D.A. Tryk, A. Fujishima, M. Watanabe, K. Yasui, H. Masuda, J. Electrochem. Soc. 2001, 148, A668.

E. Huang et al., Nature 1998, 395, 757-758.

J. Bodycomb, Y. Funaki, K. Kimishima and T. Hashimoto, Macromolecules, 1999, vol. 32, p. 2075 ff.

T.F. Jaramillo, S.H. Baeck, B.R. Cuenya, E.W. McFarland, J. Am. Chem. Soc. 2003, 125, 7148.

G. Kim and M. Libera, Macromolecules, 1998, vol. 31, p. 2569 ff.

B.J. Kim, J.J. Chiu, G. Yi, D.J. Pine, J. Am. Soc. Chem. 2005, 17, 2618-2622.

S.H. Kim, M.J. Misner, T. Xu, M. Kimura, and T.P. Russell, Advanced Materials 2004, vol. 16, p. 226 ff.

S.H. Kim, M. J. Misner, L. Yang, O. Gang, B.M. Ocko, T.P. Russell, Macromolecules 2006, vol. 39, p. 8473 ff.

M. Kimura, M.J. Misner, T. Xu, S.H. Kim, and T.P. Russell, Langmuir, 2003, vol. 19, p. 9910 ff.

T. Kubo, J.S. Parker, M.A. Hillmyer, C. Leighton, Appl. Phys. Lett. 2007, 90, 233113.

H.W. Li and W.T.S. Huck, Nano Letters, 2004, vol. 4, p. 1633-1636.

M. Li and C.K. Ober, Materials Today, 2006, vol. 9, p. 30 ff.

M. Li, C.A. Coenjarts and C.K. Ober, Advances in Polymer Science, 2005, vol. 190, p. 183 ff.

Z. Lin, D.H. Kim, X. Wu, L. Boosanda, D. Stone, L. LaRose, and T.P. Russell, Advanced Materials, 2002, vol. 14, p. 1373 ff.

Y. Lin, A. Boker, J. He, K. Sill, H. Xiang, C. Abetz, X. Li, J. Wang, T. Emrick, S. Long, Q. Wang, A. Balazs, T.P. Russell, Nature 2005, 434, 55.

W.A. Lopes, H.M. Jaeger, Nature 2001, 414, 735.

S. Ludwigs, A. Boker, A. Voronov, N. Rehse, R. Magerle, and G. Krausch, G. Nature Materials, 2003, vol. 2, p. 744 ff.

A.M. Mayes, S.K. Kumar, MRS Bulletin, 1997, 22, 43.

M.V. Meli, A. Badia, P. Grutter, R.B. Lennox, Nano. Lett. 2002, 2, 131.

Y. Morikawa, S. Nagano, K. Watanabe, K. Kamata, T. Lyoda and T. Seki, Advanced Materials, 2006, vol. 18, p. 883 ff.

P. Mansky, Y. Liu, E. Huang, T.P. Russell, and C.J. Hawker, Science 1997, vol. 275, p. 1458-1460.

S. Park, B. Kim, J.Y. Wang, and T.P. Russell, Advanced Materials, 2008, vol. 20, p. 681.

M. Park, P.M. Chaikin, R.A. Register, D.H. Adamson, Appl. Phys. Lett. 2001, 79, 257.

S. Park, J. Y. Wang, B. Kim, W. Chen, and T.P. Russell, Macromolecules 2007, vol. 40, p. 9059 ff.

S. Park, J.Y. Wang, B. Kim, and T.P. Russell, From Nanorings to Nanodots by Patterning with Block Copolymers, Nano Letters 2008, 8, 1667.

Park et al., Macroscopic 10-Terabit-per-Square-Inch Arrays from Block Copolymers with Lateral Order, Science, vol. 323, pp. 1030-1033 (print edition Feb. 20, 2009).

V. Pelletier, K. Asakawa, M. Wu, D.H. Adamson, R.A. Register, and P.M. Chaiken, Applied Physics Letters, 2006, vol. 88, pp. 211114 ff.

L. Rockford, Y. Liu, T.P. Russell, M. Yoon, and S.C.J. Mochrie, Physical Review Letters, 1999, vol. 82, p. 2602-2605.

Rockford et al., Propagation of nanopatterned substrate templated ordering of block copolymer in thick films, Macromolecules 34, 1487 (2001).

Ross, Annual Review of Materials Research, 2001, vol. 31, p. 203 ff.

T.P. Russell, P. Lambooy, J.G. Barker, P.D. Gallagher, S.K. Satija, G.J. Kellogg, and A.M. Mayes, Macromolecules 1995, 28, 787.

S.A. Maier, M.L. Brongersma, P.G. Kik, S. Meltzer, A.A.G. Requicha, and H.A. Atwater, Advanced Materials, 2001, vol. 13, p. 1501 ff.

R.A. Segalman, Materials Science and Engineering, 2005, vol. R48, p. 191 ff.

R.A. Segalman, H. Yokoyama and E.J. Kramer, Advanced Materials, 2001, vol. 13, p. 1152 ff.

B.H. Sohn, J.M. Choi, S.I. Yoo, S.H. Yun, W.C. Zin, J.C. Jung, M. Kanehara, T. Hirata, T. Teranishi, J. Am. Soc. Chem. 2003, 125, 6368.

B.H. Sohn, B.W. Seo, S.I. Yoo, W.C. Zin, Langmuir 2002, 18,10505.

S. Song, S.G.J. Mochrie, and G.B. Stephenson, Physical Review Letters, 1995, vol. 74, p. 5240-5243.

S. Song, and S.G.J. Mochrie, Physical Review B, 1995, vol. 51, p. 10068 ff.

M.P. Stoykovich et al., Science 2005, vol. 308, p. 1442 ff.

C. Tang, A. Tracz, M. Kruk, R. Zhang, D.- M. Smilgies, K. Matyjaszewski, and T. Kowalewski, Journal of the American Chemical Society, 2005, vol. 127, p. 6918 ff.

R.B. Thompson, V.V. Ginburg, M.W. Matsen, A.C. Balazs, Science 2001, 292, 2469.

T. Thurn-Albrecht, J. DeRouchey, and T.P. Russell, Macromolecules, 2000, vol. 33, pp. 3250-3253.

T. Thurn-Albrecht, J. Schotter, G.A. Kastle, N. Emley, T. Shibauchi, L. Krusin-Elbaum, K. Guarini, C.T. Black, M.T. Tuominen, T. Russell, P. Science 2000, 290, 2126.

M.A. Villar, D.R. Rueda, F. Ania, and E.L. Thomas, Polymer, 2002, vol. 43, p. 5139 ff.

D. Wyrwa, N. Beyer, and G. Schmid, G. Nano Letters, 2002, vol. 2, p. 419.

T. Xu, C.J. Hawker, and T.P. Russell, Advanced Functional Materials 2003, 13, 698.

Asakawa et al, "Nano-Patterning for Patterned Media Using Block-Copolymer", Journal of Photopolymer Science and Technology, vol. 15, No. 2, 2002, p. 465-470.

Bal et al, "Nanofabrication of integrated magnetoelectronic devices using patterned self-assembled copolymer templates", Applied Physics Letters vol. 81, No. 18, 2002, p. 3479-3481.

Black et al, "Integration of self-assembled diblock copolymers for semiconductor capacitor fabrication", Applied Physics Letters, vol. 79, No. 3, 2001, p. 409-411.

Chan et al, "Ordered Bicontinuous Nanoporous and Nanorelief Ceramic Films from Self Assembling Polymer Precursers", Science 286, 1999, p. 1716-1719.

Cheng et al, "Formation of a Cobalt Magnetic Dot Array via Block Copolymer Lithography", Advanced Materials 13, 2001, 5 pages.

De Rosa et al, "Microdomain patters from directional eutectic solidification and epitaxy", Nature 405, 2000, 5 pages.

Du et al, "Additive-Driven Phase-Selective Chemistry in Block Copolymer Thin Films: The Convergence of Top-Down and Bottom-Up Approaches", Advanced Materials, vol. 16, No. 12, 2004, p. 953-957.

Elhadji et al, "Orientation of self-assembled block copolymer cylinders perpendicular to electric field in mesoscale film", Applied Physics Letters, vol. 82, No. 6, 2003, p. 871-873.

Fasolka et al, "Block Copolymer Thin Films: Physics and Applications", Ann. Rev. Mater. Res. 31, 2004, 18 pages.

Fukunaga et al, "Large-Scale Alignment of ABC Block Copolymer Microdomains via Solvent Vapor Treatment", Macromolecules 33, 2000, p. 947-953.

Fukutani et al, "Ultrahigh Pore Density Nanoporous Films Produced by the Phase Separation of Eutectic Al-Si for Template-Assisted Growth of Nanowire Arrays", Advanced Materials, vol. 16, No. 16, 2004, p. 1456-1460.

Gaubert et al, "Highly parallel fabrication of nanopatterned surfaces with nanoscale orthogonal biofunctionalization imprint lithography", Nanotechnology, 18, 2007, p. 1-7.

Guarini et al, "Nanoscale patterning using self-assembled polymers for semiconductor applications", J. Vac. Sci. Tech. B 19, 2001, 5 pages.

Harrison et al, "Lithography with a mas of block copolymer microstructures", J. Vac. Sci. Technol. B 16(2), 1998, p. 544-552.

Hartney et al, "Block copolymers as bilevel resists", J. Vac. Sci. Tech. B 3, 1985, p. 1346-1351.

Haupt et al, "Nanoporous Gold Films Created using Templates Formed from Self-Assembled Structures of Inorganic-Block Copolymer Micelles", Advance Materials 15, 2003, 3 pages.

Heier et al, "Thin Diblock Copolymer Films on Chemically Heterogeneous Surfaces", Macromolecules 30, 1997, p. 6610-6614.

Huang et al, "Modeling copolymer Adsorption on laterally Hetergeneous Surfaces", Physical REview aletters, vol. 66, No. 5, 1991, p. 620-623.

International Search Report and Written Opinion for PCT/2008057187, mailing date Apr. 8, 2008, 16 pages.

International Search Report for PCT/US2008057187, mailing date Apr. 8, 2008, 7 pages.

JP2001189466, EPO Abstract, Jul. 10, 2010, 2 pages.

Kim et al, "Epitaxial self-assembly of block copolymers on lithographically defined nanopatterned substrates", Nature 424, 2003, p. 411-414.

Lammertink et al, "Nanostructured Thin Films of Organic-Organometallic Block Copolymers: One-Step Lithography with Poly(ferrocenylsilanes) by Reactive Ion Etching", Advance Materials, 12, 2000, 6 pages.

Lammertink et al, "Poly(ferrocenyldimethylsilanes) for Reactive Ion Etch Barrier Applications", Chem. Mater. 13, 2001, p. 429-434.

Li et al. Dense arrays of ordered GaAS nanostructures by selective area growth on substrates patterned by block copolymer lithography, Appl. Phys. Lett, 76, 2000, p. 1689-1691.

Li et al. Spatially controlled fabrication of nanoporous block copolymers. Chem. Mater. 16, 3800, 2004, 1 page, Abstract.

Mansky et al, "Large-Area Domain Alignment in Block Copolymer Thin Films Using Electric Fields", Macromolecules 31, 1998, p. 4399-4401.

Morkved et al, "Local Control of Microdomain Orientations in Diblock Copolymer Thin Filmes with Electric Fields", Science, vol. 273, 1996, p. 931-933.

Park et al, "Block Copolymer Lithography: Periodic Arrays of ~ 10 Holes in 1 Square Centimeter", Science, vol. 276, 1997, p. 1401-1404.

Park et al, "A simple route to highly oriented and ordered nanoporous block copolymer templates", ACS Nano, vol. 2, No. 4, 2008, p. 766-772.

Park et al, "Large area orientation of block copolymer microdomains in thin films via directional crystallization of a solvent", Macromolecules, 34, 2001, p. 2602-2606.

Pereira et al, "Diblock Copolymer Thin Film Melts on Striped, Heterogeneous Surfaces: Parallel, Perpendicular and Mixed Lamellar Morphologies", Macromolecules 32, 1999, p. 758-764.

Russell et al, "Block Copolymers As Nanoscopic Templates", Macromol. Symp. 159, 2000, p. 77-88.

Spatz et al, "Micellar Inorganic—Polymer Hybrid Systems—A Tool for Nanolithography", Advanced Materials 11, No. 2, 1999, p. 149-153.

Spatz et al, "A Combined Top-Down/Bottom-Up Approach to the Microscopic Localization of Metallic Nanodots", Advanced Materials, vol. 14, No. 24, 2002, p. 1827-1832.

Spatz et al, "Ultrathin Diblock Copolymer/Titanium Laminates—A Tool for Nanolithography", Advanced Materials 10, 1998, p. 849-852.

Stoykovich et al, "Block copolymers and conventional lithography", Materials Today, vol. 9, No. 9, 2006, p. 20-29.

Temple et al, "Spontaneous Vertical Ordering and Pyrolytic Formation of Nanoscopic Cermaic Patterns from Poly (styrene-b-ferrocenysilane)", Advanced Materials 15, 2003, 13 pages.

Thurn-Albrecht et al, "Nanoscopic Templates from Oriented Block Copolymer Films", Advance Materials 12, 2000, 4 pages.

U.S. Appl. No. 12/049,541 Non-Final Office Action, Mar. 1, 2011, 52 pages.

Wang et al, "Simulations of the Morphology of Cylinder-Forming Asymmetric Diblock Copolymer Thin Films on Nanopatterned Substrates", Macromolecules 36, 2000, p. 1731-1740.

Wang et al, "One step fabrication and characterization of platinum nanopore electrode ensembles formed via amphiphilic block copolymer self-assembly", Science Direct 52, 2006, p. 704-709.

Williams et al, "Etch Rates for Micromachining Processing—Part II", J. Micro. Sys. vol. 12, No. 6, 2003, p. 761-778.

Xu et al, "Interfacial Energy Effects on the Electric Field Alignment of Symmetric Diblock Copolymers", Macromolecules 36, 2003, p. 6178-6182.

Xu et al, "The influence of molecular weight on nanoporous polymer films", Polymer 42, 2001, p. 9091-9095.

Yang et al, "Guided Self-Assembly of Symmetric Diblock Copolymer Films on Chemically Nanopatterned Substrates", Macromolecules 33, 2000, p. 9575-9582.

Zalusky et al, "Mesoporous Polystyrene Monoliths", J. Am. Chem. Soc. 123, 2001, p. 1519-1520.

* cited by examiner

METHOD OF PRODUCING NANOPATTERNED ARTICLES, AND ARTICLES PRODUCED THEREBY

CROSS REFERENCE TO RELATED APPLICATION

This application claims the benefit of U.S. Provisional Patent Application Ser. No. 61/098,253 filed Sep. 19, 2008, which is fully incorporated herein by reference.

STATEMENT REGARDING FEDERALLY SPONSORED RESEARCH & DEVELOPMENT

The U.S. Government has certain rights in this invention pursuant to National Science Foundation MRSEC on Polymers Grant No. DMR-0213695, and Department of Energy, Office of Basic Energy Sciences Grant No. DE-FG02-96ER45612.

BACKGROUND OF THE INVENTION

For nanotechnological applications, the use of thin films of materials is highly preferred. See, for example, R. A. Segalman, *Materials Science and Engineering*, 2005, volume R48, page 191 ff.; M. Li and C. K. Ober, *Materials Today*, 2006, volume 9, page 30 ff.; C. J. Hawker and T. P. Russell, *MRS Bulletin*, 2005, volume 30, page 952 ff.; and M. Li, C. A. Coenjarts, and C. K. Ober, *Advances in Polymer Science*, 2005, volume 190, page 183 ff. It would be desirable, in the case of block copolymers (BCPs), to have the nanoscopic domains, sometimes referred to as microdomains, oriented in a specific direction with a long-range lateral order for applications such as polarizers (see, for example, V. Pelletier, K. Asakawa, M. Wu, D. H. Adamson, R. A. Register, and P. M. Chaiken, *Applied Physics Letters*, 2006, volume 88, page 211114 ff.), templates for pattern transfer to generate microelectronic integrated circuits (see, for example, C. T. Black, *IEEE Transactions on Nanotechnology*, 2004, volume 3, page 412 ff.), magnetic media (see, for example, C. A. Ross, *Annual Review of Materials Research*, 2001, volume 31, page 203 ff.), and optical waveguides (see, for example, C. A. Ross, *Annual Reviews of Materials Research*, 2001, volume 31, page 203 ff.; and S. A. Maier, M. L. Brongersma, P. G. Kik, S. Meltzer, A. A. G. Requicha, and H. A. Atwater, *Advanced Materials*, 2001, volume 13, page 1501 ff.). In recent years, a number of approaches have been developed to control the orientation and enhance the lateral order of the microdomains by applying external fields, such as electric fields (see, for example, T. Thurn-Albrecht, J. DeRouchey, and T. P. Russell, *Macromolecules*, 2000, volume 33, page 3250 ff.), shear (see, for example, M. A. Villar, D. R. Rueda, F. Ania, and E. L. Thomas, *Polymer*, 2002, volume 43, page 5139 ff.), temperature gradients (see, for example, J. Bodycomb, Y. Funaki, K. Kimishima, and T. Hashimoto, *Macromolecules*, 1999, volume 32, page 2075 ff.), graphoepitaxy (see, for example, R. A. Segalman, H. Yokoyama, and E. J. Kramer, *Advanced Materials*, 2001, volume 13, page 1152 ff.), chemically patterned substrates (see, for example, M. P. Stoykovich, M. Müller, S. O. Kim, S. O.; Solak, H. H.; Edwards, E. W.; de Pablo, J. J.; Nealey, P. F. *Science* 2005, volume 308, page 1442 ff.), controlled interfacial interactions (see, for example, P. Mansky, Y. Liu, E. Huang, T. P. Russell, and C. J. Hawker, *Science*, 1997, volume 275, page 1458 ff.; and E. Drockenmuller, L. Y. T. Li, D. Y. Ryu, E. Harth, T. P. Russell, H. C. Kim, and C. J. Hawker, *Journal of Polymer Science, Part A: Polymer Chemistry*, 2005, volume 43, page 1028 ff.), zone casting (see, for example, C. Tang, A. Tracz, M. Kruk, R. Zhang, D.-M. Smilgies, K. Matyjaszewski, and T. Kowalewski, *Journal of the American Chemical Society*, 2005, volume 127, page 6918 ff.), optical alignment (see, for example, Y. Morikawa, S. Nagano, K. Watanabe, K. Kamata, T. Iyoda, and T. Seki, *Advanced Materials*, 2006, volume 18, page 883 ff.), solvent fields (see, for example, G. Kim and M. Libera, *Macromolecules*, 1998, volume 31, page 2569 ff.; M. Kimura, M. J. Misner, T. Xu, S. H. Kim, and T. P. Russell, *Langmuir*, 2003, volume 19, page 9910 ff.; S. Ludwigs, A. Böker, A. Voronov, N. Rehse, R. Magerle, and G. Krausch, G. *Nature Materials*, 2003, volume 2, page 744 ff.; S. H. Kim, M. J. Misner, T. Xu, M. Kimura, and T. P. Russell, *Advanced Materials*, 2004, volume 16, page 226 ff.; R.-M. Ho, W.-H. Tseng, H.-W. Fan, Y.-W. Chiang, C.-C. Lin, B.-T. Ko, and B.-H. Huang, *Polymer*, 2005, volume 46, page 9362 ff.; Z. Lin, D. H. Kim, X. Wu, L. Boosanda, D. Stone, L. LaRose, and T. P. Russell, *Advanced Materials*, 2002, volume 14, page 1373 ff.; J. Hahm and S. J. Sibener, *Langmuir*, 2000, volume 16, page 4766 ff.; and S. Park, B. Kim, J.-Y. Wang, and T. P. Russell, *Advanced Materials*, 2008, volume 20, page 681 ff.), and so on. Solvent evaporation is a strong and highly directional field. Making BCP thin films under various solvent evaporation conditions has been found to be a good way to manipulate the orientation and lateral ordering of BCP microdomains in thin films Kim et al. first reported that solvent evaporation could be used to induce the ordering and orientation of BCP microdomains. G. Kim and M. Libera, *Macromolecules*, 1998, volume 31, page 2569 ff. Vertically aligned cylindrical polystyrene microdomains could be obtained in polystyrene-b-polybutadiene-b-polystyrene triblock copolymer thin films with a thickness of about 100 nanometers. The same effect was also observed in polystyrene-b-poly(ethylene oxide) (PS-b-PEO) and polystyrene-b-poly(L-lactide) BCP thin films and was attributed to a copolymer/solvent concentration gradient along the direction normal to the film surface giving rise to an ordering front that propagated into the film during solvent evaporation. R.-M. Ho, W.-H. Tseng, H.-W. Fan, Y.-W. Chiang, C.-C. Lin, B.-T. Ko, and B.-H. Huang, *Polymer*, 2005, volume 46, page 9362 ff.; Z. Lin, D. H. Kim, X. Wu, L. Boosanda, D. Stone, L. LaRose, and T. P. Russell, *Advanced Materials*, 2002, volume 14, page 1373 ff. This orientation was independent of the substrate. However, the lateral ordering of the cylindrical microdomains was poor. Hahm et al. and later Kimura et al. showed that evaporation-induced flow in solvent cast BCP films produced arrays of nanoscopic cylinders oriented normal to the surface with a high degree of ordering. J. Hahm and S. J. Sibener, *Langmuir*, 2000, volume 16, page 4766 ff.; and M. Kimura, M. J. Misner, T. Xu, S. H. Kim, and T. P. Russell, *Langmuir*, 2003, volume 19, page 9910 ff. Recently, Ludwigs et al. demonstrated that solvent annealing could markedly enhance the ordering of BCP microdomains in thin films S. Ludwigs, A. Böker, A. Voronov, N. Rehse, R. Magerle, and G. Krausch, G. *Nature Materials*, 2003, volume 2, page 744 ff. By controlling the rate of solvent evaporation and solvent annealing in thin films of PS-b-PEO, Kim et al. achieved nearly-defect-free arrays of cylindrical microdomains oriented normal to the film surface that spanned the entire films S. H. Kim, M. J. Misner, T. Xu, M. Kimura, and T. P. Russell, *Advanced Materials*, 2004, volume 16, page 226 ff. Moreover, the use of a co-solvent enabled further control over the length scale of lateral ordering. The most recent results showed that perpendicular cylindrical microdomains oriented normal to the film surface could be obtained directly by spin-coating polystyrene-b-poly(4-vinylpyridine) (PS-b-P4VP) BCPs from mixed solvents of toluene and tetrahydrofuran (THF) and arrays of highly ordered cylindrical microdomains formed over large areas after exposing the films in the vapor of a toluene/THF mixture. This process was independent of substrate, but strongly depended on the quality of the solvents for each block and the solvent evaporation rate. S. Park, J.-Y. Wang, B. Kim, W. Chen, and T. P. Russell, *Macromolecules* 2007, volume 40, page 9059 if But, the ultimate achievable data storage density achievable with these BCPs will not exceed 1 terabit per square inch (Tbit/in$^2$). Processes to use alternate BCPs, like PS-b-P4VP or PS-b-PEO containing salt, have been developed that are simpler to employ and, more importantly, the interactions between the segments of the copolymer are very non-favorable, making defects energetically costly and, also, opening an avenue to smaller domain sizes and separation distances. S. H. Kim, M. J. Misner, L. Yang, O. Gang, B. M. Ocko, T. P. Russell, *Macromolecules* 2006, volume 39, page 8473 ff.

Several methods have been developed to prepare nearly perfect patterns in polymer surfaces on substrates. Conventional photolithography, electron beam (e-beam) lithography, and scanning force probe lithography are accessible techniques for fabrication of nanometer-size patterns. For example, Schmidt and co-workers showed the successful electrochemical modification of self-assembled monolayers at positions where a conductive scanning probe was in contact with a self-assembled monolayer. D. Wyrwa, N. Beyer, and G. Schmid, G. *Nano Letters,* 2002, volume 2, page 419 ff. The induced chemical contrast was used to guide the covalent binding of Au crystals from solution. E-beam lithography is a common method for fabrication of sub-micrometer structures. Although a beam of electrons may be focused to less than 1 nanometer in diameter, the resolution is limited by the interaction of the beam with the resist material and by the radius of gyration of the macromolecules, which is usually a few nanometers. See, for example, J. M. Gibson, *Physics Today,* 1997, volume 50, page 56 ff. New developments in using self-assembled monolayers overcome these restrictions inherent with standard resist materials as their thickness is usually a few angstroms. Structures as small as a few nanometers were fabricated by using this concept. See, for example, A. Gölzhäuser, W. Eck, W. Geyer, V. Stadler, T. Weimann, P. Hinze, and M. Grunze, *Advanced Materials,* 2001, volume 13, page 806 ff.; R. Glass, M. Arnold, E. A. Cavalcanti-Adam, J. Blümmer, C. Haferkemper, C. Dodd, and J. P. Spatz, *New Journal of Physics,* 2004, volume 6, page 101 ff.; and S.-M. Yang, S. G. Jang, D.-G. Choi, U.S. Pat. No. 7,081,269 B2 (2006). However, these approaches require expensive equipment and high-energy doses, and they are not suitable for non-conductive substrates unless additional treatment is carried out. Moreover, e-beam patterning is a time-consuming serial process not suitable for large areas.

It is highly desirable to develop parallel processes where the sequential generation of nanoscopic features is avoided and the patterning is achieved in one step. Nanoimprint lithography (NIL) is one such process to control the positional order of the microphase separated morphology. NIL can be used for locally controlling the self-assembly process of block copolymers and determining the precise positioning of the phase-separated domains via the topography of mold, rather than the substrate. NIL creates features by a mechanical deformation of a polymer film by pressing a hard mold into the film at temperatures higher than the glass transition temperature of the polymer. This high-throughput, low cost process is not diffraction limited, and sub-10 nanometer resolution has been reported. See, for example, S. Y. Chou, P. R. Krauss, W. Zhang, L. Guo, and L. Zhuang, *Journal of Vacuum Science and Technology B,* 1997, volume 15, page 2897 ff.; H.-W. Li and W. T. S. Huck, *Nano Letters,* 2004, volume 4, page 1633 ff.; S. Y. Chou, U.S. Pat. No. 5,772,905 (1998); and J.-H. Jeong, H. Sohn, Y.-S. Sim, Y.-J. Shin, E.-S. Lee, and K.-H. Whang, U.S. Pat. No. 6,943,117 B2 (2005). Yet, NIL has the limitation that it requires a master that is used for the printing and, as of yet, it has not been possible to generate a perfect master with uniform, nanoscopic features sizes less than 20 nanometers over large lateral distances while maintaining the features in register.

BRIEF DESCRIPTION OF THE INVENTION

The present invention utilizes the perfect crystal ordering of a crystalline substrate, like single crystal silicon, to produce a topographic patterning of a surface of the substrate that in turn guides the placement of the nanoscopic features in a block copolymer film formed on the patterned surface of the substrate. For example, miscut silicon single crystals can be used to produce large areas of saw-tooth like surface morphologies. A characteristic lateral spacing between topological features of less than 100 nanometers can be achieved over surface areas of centimeter-squared dimensions. The combination of substrate-induced block copolymer morphology and solvent annealing of block copolymer thin films can be used to fabricate nanoporous templates or scaffolds having feature sizes of about 5 nanometers over an entire wafer of arbitrary size. The process is compatible with existing fabrication technologies and is, therefore, nondisruptive.

One embodiment is a method of preparing a nanopatterned surface, comprising: forming a block copolymer film on an annealed, miscut surface of a crystalline substrate; annealing the block copolymer film; and surface reconstructing the annealed block copolymer film.

Another embodiment is a layered article prepared by the process.

These and other embodiments are described in detail below.

BRIEF DESCRIPTION OF THE FIGURES

FIG. 1(A) shows the substrate 1; FIG. 1(B) shows the block copolymer film-coated substrate 10; FIG. 1(C) shows the annealed block copolymer film-coated substrate 20; FIG. 1(D) shows the solvent-reconstructed, annealed block copolymer film-coated substrate 30.

FIG. 1(A) shows the solvent-reconstructed, annealed block copolymer film-coated substrate 30; FIG. 1(B) shows the resist-coated, solvent-reconstructed, annealed block copolymer film-coated substrate 40; FIG. 1(C) shows the etched, resist-coated, solvent-reconstructed, annealed block copolymer film-coated substrate 50.

FIG. 9(A) represents the hexagonal cylinder viewed from the direction of cylindrical axes, the (10) symmetric plane; FIG. 9(B) was obtained when the sample stage was rotated to 30 degrees from the (10) symmetric plane.

DETAILED DESCRIPTION OF THE INVENTION

Figure 1:
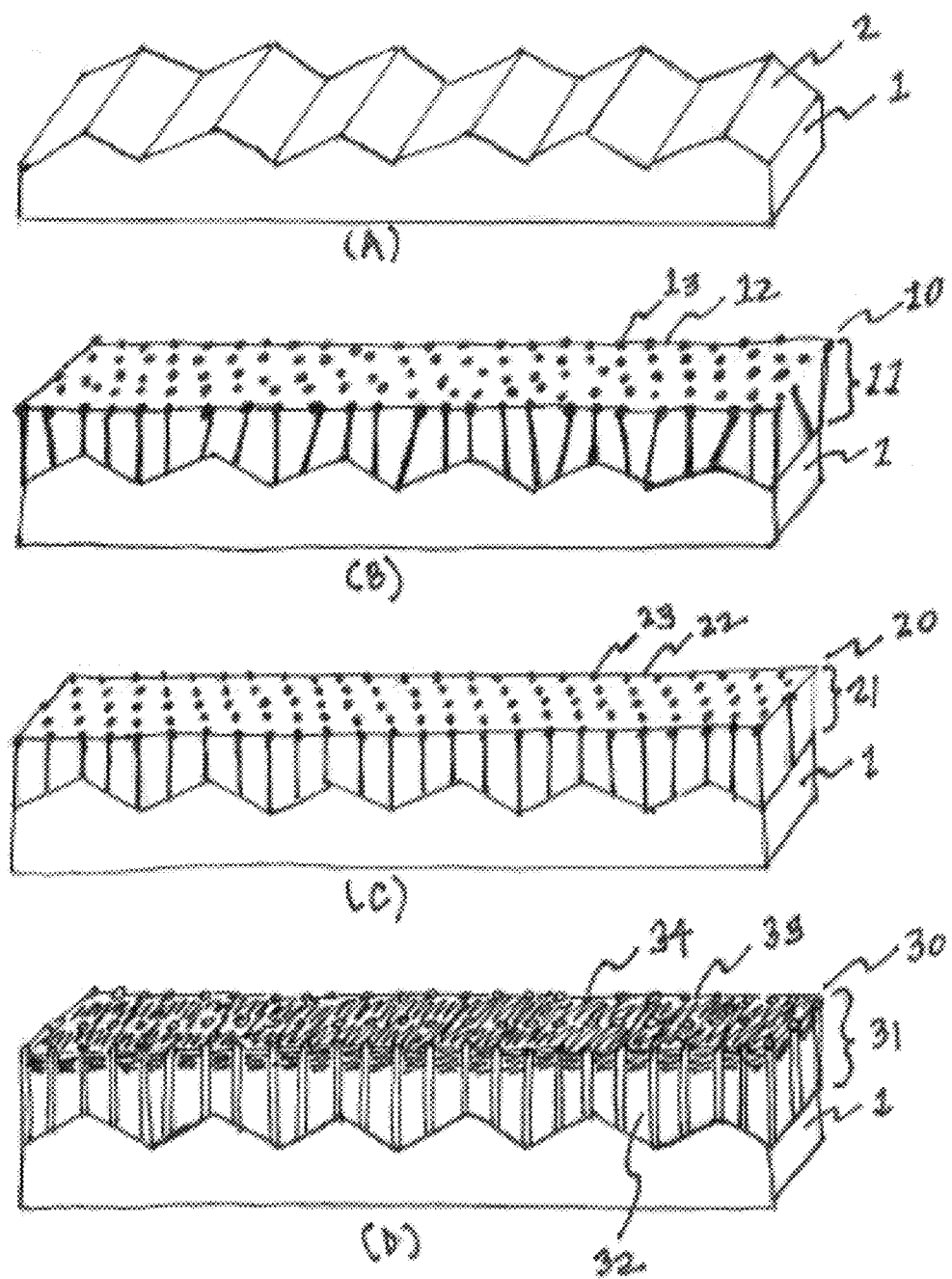
FIG. 1 is a schematic illustration of articles associated with the present method.

One embodiment is a method of preparing a nanopatterned surface, comprising: forming a block copolymer film on an annealed, miscut surface of a crystalline substrate; annealing the block copolymer film; and surface reconstructing the annealed block copolymer film. In the first step of the method, a block copolymer film is formed on an annealed, miscut surface of a crystalline substrate. The substrate surface provides a highly regular pattern of topographic features over large (at least centimeter) distances. In some embodiments, the crystalline substrate consists essentially of a single crystal. In this context, the phrase "consists essentially of" allows levels of dopants and impurities that do not substantially detract from the regularity of the surface topology. One useful class of crystalline substrates includes crystalline silicon and doped crystalline silicon. Another useful class of crystalline substrates is crystalline aluminum oxides (which, in some forms, are known as "sapphire" or "corundum").

As used herein the term "nanopatterned surface" refers to a surface comprising repeating chemical and/or topographical homogeneities that have dimensions on the nanometer scale. In some embodiments, the nanopatterned surface is the top surface of the annealed block copolymer film (where "top" is interpreted in terms of a structure in which the block copolymer film is on top of the topographically patterned surface of the polymeric replica). In these embodiments, the annealed block copolymer film can comprise chemical inhomogeneities in the form of cylinders or stripes (lamellae) perpendicular to the plane of the film, or spheres, cylinders, or stripes parallel to the plane of the film. In other embodiments, the nanopatterned surface is the top surface of a structure produced after further processing of the annealed block copolymer film. For example, the nanopatterned surface can be the top surface of a block copolymer film produced by solvent reconstruction of the annealed block copolymer film. As another example, the nanopatterned surface can be the top surface of a structure produced by coating a resist from a glancing angle onto the solvent-reconstructed, annealed block copolymer film. As yet another example, the nanopatterned surface can be the product of depositing a magnetic material directly (perpendicularly) onto the top surface and into the pores of a structure that is the product of solvent-reconstructing the block copolymer film, resist-coating the solvent-reconstructed block copolymer film, and etching the resist-coated block copolymer film to create voids in the underlying polymeric substrate corresponding to the voids of the solvent-reconstructed block copolymer film. In each of these examples, the nanopattern has dimensions corresponding to the dimensions of the cylinders, stripes, spheres, or lamellae of the annealed block copolymer film.

The block copolymer film is formed on an annealed surface of the crystalline substrate. This means that the substrate has been heated to a temperature at which a regularly repeating surface topology is formed, then cooled to preserve that topology so that it is present under the conditions with which the block copolymer film is formed. For example, miscut silicon can be annealed by heating to a temperature of approximately 1262° C. for one minute, then rapidly cooling to 1027° C., followed by slow cooling to room temperature. As another example, miscut C-plane sapphire can be annealed by heating in air at 1100° C. for 10 hours, followed by cooling to room temperature.

The surface of the crystalline substrate on which the block copolymer film is formed is miscut. As used herein, the term "miscut" means that the crystalline surface is at least 1 degree removed from any crystallographic plane of the crystalline substrate. In some embodiments, the crystalline surface is removed from any crystallographic plane by 1 to 10 degrees, specifically 2 to 8 degrees, more specifically 3 to 6 degrees. It will be understood that the term "miscut" includes some crystalline surfaces, such as miscut sapphire, that are conventionally defined with reference to a surface normal (rather than the surface plane).

There is no particular limit on the topology of the annealed, miscut surface. In some embodiments, the annealed, miscut surface of the crystalline substrate exhibits a saw-tooth pattern. The saw-tooth pattern can be characterized by a peak-to-peak separation of about 24 to about 200 nanometers and a peak-to-valley separation of about 3 to about 20 nanometers. Within the range of 24 to 200 nanometers, the peak-to-peak separation can be 30 to 150 nanometers, specifically 40 to 120 nanometers, more specifically 50 to 100 nanometers. Within the range of 3 to 20 nanometers, the peak-to-valley separation can be 5 to 18 nanometers, specifically 8 to 15 nanometers.

In some embodiments, the annealed, miscut surface of the crystalline substrate exhibits a grooved pattern. The grooved pattern can be characterized by a groove depth of about 3 to about 20 nanometers and a groove-to-groove separation of about 24 to about 200 nanometers. Within the range of about 3 to about 20 nanometers, the groove depth can be 5 to 18 nanometers, specifically 8 to 15 nanometers. Within the range of 24 to 200 nanometers, the groove-to-groove separation can be about 30 to about 150 nanometers, specifically 40 to 120 nanometers, more specifically 50 to 100 nanometers.

In some embodiments, the annealed, miscut surface of the crystalline substrate is chemically homogeneous. In other embodiments, the annealed, miscut surface of the crystalline substrate is chemically patterned. One example of a chemically patterned surface is a surface comprising stripes of oxide and metal. As background, see L. Rockford, Y. Liu, T. P. Russell, M. Yoon, and S. C. J. Mochrie, *Physical Review Letters,* 1999, volume 82, page 2602 ff.

Methods of forming crystalline substrates with miscut, annealed surfaces are described in, for example, S. Song, S. G. J. Mochrie, and G. B. Stephenson, *Physical Review Letters,* 1995, volume 74, page 5240 ff.; and S. Song and S. G. J. Mochrie, *Physical Review B,* 1995, volume 51, page 10068 ff. Specific procedures for forming annealed surfaces on miscut silicon and sapphire are provided in the working examples below.

Once a crystalline substrate with an annealed, miscut surface is prepared, a block copolymer film is formed on the surface. In some embodiments, forming the block copolymer film comprises spin coating the block copolymer film from solution onto the annealed, miscut surface of the crystalline substrate. For example, a solution comprising a polystyrene-poly(4-vinylpyridine) diblock copolymer in a mixture of toluene and tetrahydrofuran can be spin coated onto crystalline silicon or crystalline aluminum oxide.

In order to form at least two domains in the block copolymer film, the block copolymer should comprise at least two chemically distinct blocks. There is no particular limitation on the chemical composition of the block copolymer blocks, provided that block copolymer comprises a first block and second block that are sufficiently incompatible with each other to form separate phases. Incompatibility of the two block can be characterized by a difference in the Hildebrand solubility parameters of the two blocks. For example, when the block copolymer comprises a first block having a first Hildebrand solubility parameter and a second block having a second Hildebrand solubility parameter, the first Hildebrand solubility parameter and the second Hildebrand solubility parameter can differ by at least 0.4 megapascal$^{1/2}$.

In some embodiments, the block copolymer comprises at least one block selected from the group consisting of polyolefins, poly(alkenyl aromatic)s, poly(conjugated dienes)s, hydrogenated poly(conjugated dienes)s, poly(vinyl-substituted nitrogen heterocycle)s, poly(alkyl (meth)acrylate)s, poly((meth)acrylic acid)s, poly(alkylene oxide)s, poly(arylene oxide)s, poly(arylene sulfide)s, poly(vinyl alkanoates), poly(vinyl ether)s, poly(vinyl halide)s, poly(vinyl alcohol)s, polyurethanes, poly(meth)acrylonitriles, polyesters, polyamides, polyimides, polycarbonates, polysulfones, and polysiloxanes.

In some embodiments, the block copolymer comprises a poly(alkenyl aromatic) block that is the polymerization product of an alkenyl aromatic monomer having the structure

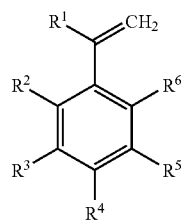

wherein $R^1$ is hydrogen or $C_1$-$C_6$ alkyl, and each occurrence of $R^2$, $R^3$, $R^4$, $R^5$, and $R^6$ is independently selected from the group consisting of hydrogen, $C_1$-$C_6$ alkyl, and halogen. In some embodiments, the block copolymer comprises a polystyrene block.

In some embodiments, the block copolymer comprises a poly(vinyl-substituted nitrogen heterocycle) block that is the polymerization product of a vinyl-substituted nitrogen heterocycle selected from the group consisting of 2-vinylpyridine, 3-vinylpyridine, 4-vinylpyridine, 2-methyl-5-vinylpyridine 1-vinylimidazole, 2-vinylimidazole, 4-vinylimidazole, N-vinyl-2-methylimidazole, N-vinyl-2-ethylimidazole, 2-vinylpyrrole, 3-vinylpyrrole, and mixtures thereof. In some embodiments, the block copolymer comprises a poly(4-vinylpyridine) block or a poly(2-vinylpyridine) block.

The block copolymer can comprise the first block and the second block in a volume ratio of about 1:10 to about 10:1.

In some embodiments, the molecular weight of the first block is substantially larger than the molecular weight of the second block. For example, the first block and the second block can differ in number average molecular weight by at least a factor of 1.5, specifically a factor of 1.5 to 6, more specifically a factor of 2 to 5, still more specifically a factor of 3 to 4.

In a very specific embodiment, the block copolymer is a polystyrene-poly(4-vinylpyridine) or polystyrene-poly(2-vinylpyridine) diblock copolymer. In another very specific embodiment, the block copolymer is a polystyrene-poly(ethylene oxide) diblock copolymer.

The block copolymer film typically has a thickness of about 10 to about 100 nanometers. In some embodiments, the block copolymer film has a thickness corresponding to about one period of the block copolymer. The relationship between film thickness and the period of the block copolymer can be determined using methods known in the art. See, for example, T. P. Russell, P. Lambooy, J. G. Barker, P. D. Gallagher, S. K. Satija, G. J. Kellogg, and A. M. Mayes, *Macromolecules* 28, 787 (1995); and A. M. Mayes, S. K. Kumar, *MRS Bulletin*, volume 22, page 43 ff. (1997).

Once the block copolymer film is formed, it is annealed. In some embodiments, the block copolymer film is thermally annealed. For example, when the block copolymer is a polystyrene-block-poly(n-butyl methacrylate) diblock copolymer, the block copolymer can be annealed at 170° C. for four days. In other embodiments, the block copolymer film is annealed by exposure to solvent vapors. For example, when the block copolymer is a polystyrene-poly(4-vinylpyridine) diblock copolymer, the annealing solvent vapor can comprise toluene and tetrahydrofuran.

In some embodiments, the annealed block copolymer film comprises a hexagonal array of cylindrical microdomains. Such hexagonal arrays can exhibit an orientation order of at least 0.9 over an area of at least 1 centimeter. Orientation order can be determined by image analysis of scanning force microscopy images of the block copolymer films using, for example, MATLAB software from The Mathworks. The cylindrical microdomains can be separated by a nearest-neighbor distance of about 10 to about 100 nanometers.

In some embodiments, the annealed block copolymer film comprises a linear array of microdomains. The center-to-center spacings of the linear microdomains can be about 10 to about 100 nanometers.

After the block copolymer film is annealed, it is surface reconstructed. The surface reconstruction method is described in T. Xu, C. J. Hawker, and T. P. Russell, *Advanced Functional Materials,* 2003, volume 13, page 698 ff. and typically consists of exposing the annealed block copolymer film to a solvent that preferentially dissolves the minor phase of the block copolymer film and effects transfer of that phase to the surface of the film opposite the substrate. It is important to note that no chemical bonds are broken in the surface reconstruction process, and that the process is reversible (for example, by the application of heat). Surface reconstruction is conducted at a temperature below the glass transition temperature of the major (matrix) phase of the block copolymer film, so that the structure of the film is conserved in that the spaces formerly occupied by the minor phase are converted to voids. For example, when the minor phase consists of cylinders perpendicular to the plane of the film, surface reconstruction results in migration of the minor phase to the top surface of the film and formation of cylindrical voids where the minor phase formerly resided. The cylindrical voids extend from the substrate surface through the major phase-containing layer and the minor phase-containing layer to the top of the block copolymer film. As another example, when the minor phase consists of lines parallel to the plane of the film, surface reconstruction results in the migration of the minor phase to the top surface of the film and formation of linear voids (troughs or trenches) where the minor phase formerly resided.

In some embodiments, the block copolymer is a polystyrene-poly(4-vinylpyridine) diblock copolymer, and surface reconstructing the annealed block copolymer film comprises immersing the block copolymer film in a lower alkanol solvent such as methanol, ethanol, 1-propanol, 2-propanol, or a mixture thereof.

FIG. 1 is a schematic illustration of articles associated with the present method. FIG. 1(A) shows crystalline substrate 1 comprising an annealed, miscut surface 2 comprising a sawtooth topology. FIG. 1(B) shows the block copolymer film-coated substrate 10, which is the product of forming a block copolymer film on annealed, miscut surface 2. In FIG. 1(B), a block copolymer film 11 is disposed on annealed, miscut surface 2 of crystalline substrate 1. The block copolymer film 11 comprises a continuous phase 12 comprising the major component of the block copolymer, and a minor phase comprising cylindrical domains 13 comprising the minor component of the block copolymer. FIG. 1(C) shows the annealed block copolymer film-coated substrate 20, which is the product of annealing the block copolymer film 11. The annealed block copolymer film-coated substrate 20 comprises crystalline substrate 1 and annealed block copolymer film 21. The annealed block copolymer film 21 comprises an annealed continuous phase 22 comprising the major component of the block copolymer, and an annealed minor phase comprising annealed cylindrical domains 23. The annealed cylindrical domains 23 collectively form a hexagonal array of cylindrical domains within the continuous phase 22. The orientation order of the hexagonal array of cylindrical domains in the annealed block copolymer film 21 is significantly higher than that of the array of cylindrical domains in the block copolymer film 21 immediately after its formation on the annealed, miscut surface 2. FIG. 1(D) shows the solvent-reconstructed, annealed block copolymer film-coated substrate 30, which is the product of solvent-reconstructing the annealed block copolymer film-coated substrate 20. The solvent-reconstructed, annealed block copolymer film-coated substrate 30 comprises crystalline substrate 1 and solvent-reconstructed block copolymer film 31. The solvent reconstruction step transfers the minor phase component from the cylindrical domains to the top of the block copolymer layer. Thus, the solvent-reconstructed block copolymer film 31 comprises a major block layer 32 disposed on the annealed miscut surface 2 of the crystalline substrate 1 and composed primarily of the major component of the block copolymer. The solvent-reconstructed block copolymer film 31 further comprises a minor block layer 33, disposed on a surface of the major block layer opposite the annealed miscut surface 2 and composed primarily of the minor component of the block copolymer. The major block layer 32 and the minor block layer 33 collectively define an array of cylindrical voids 34, corresponding to spaces remaining when the minor phase of the block copolymer was transferred from the annealed cylindrical domains 23 to the top surface of the block copolymer film.

In some embodiments, the method further comprises coating an etch-resistant layer on a surface of the surface reconstructed block copolymer film to form a resist-coated block copolymer film. The etch-resistant layer can be coated using various methods known in the art, including, for example, evaporating, sputtering, chemical vapor deposition (CVD), and metalorganic chemical vapor deposition (MOCVD). The etch-resistant layer will generally include at least one material that is more etch-resistant than the block copolymer film. Suitable materials include metals, such as iron, ruthenium, osmium, cobalt, nickel, palladium, platinum, copper, silver, gold, and the like, and alloys of the foregoing. When the etch-resistant layer comprises a metal, the etch-resistant layer can be formed by evaporating the metal and allowing the evaporated metal to deposit on the top surface of the block copolymer film. In some embodiments, including those embodiments in which subsequent etching of the substrate is intended, it is desirable to avoid depositing etch-resistant material into the voids formed on surface reconstruction. In these embodiments, the etch-resistant material is deposited from a glancing angle relative to the plane of the block copolymer film. In other embodiments, it is desirable to deposit etch-resistant material into the voids formed on surface reconstruction so that the etch-resistant material is deposited through the voids onto the substrate surface. In these embodiments, the etch-resistant material is deposited from an angle approximately normal to the plane of the block copolymer film. Although the term "etch-resistant layer" is used, coating the etch-resistant material need not be followed by an etching step. For example, when the surface reconstructed block copolymer film defines a hexagonal array of cylindrical pores and the etch-resistant material is a magnetic material that is deposited from an angle approximately normal to the plane of the substrate surface, coating of the etch resistant layer can be followed by separation of the block copolymer layer from the substrate, yielding a substrate decorated with a hexagonal array of magnetic islands.

In some embodiments, coating the etch-resistant layer on the surface reconstructed block copolymer film comprises depositing gold onto the surface reconstructed block copolymer film.

One use of the method is to prepare nanopatterned substrates. Nanopatterned substrates can be prepared by etching through the resist-coated block copolymer film and into the substrate, thereby creating voids in the substrate corresponding to voids in the surface-reconstructed block copolymer layer. Suitable etching methods include for example, dry chemical etching, wet chemical etching, plasma etching, reactive ion etching, micromachining, electron beam writing, laser micromachining, ablation, ion beam milling, and the like. In some embodiments, reactive ion etching is used. Suitable precursors for reactive ion etching include, for example, tetrafluoromethane, fluorotrichloromethane, and antimony hexafluoride. In some embodiments, etching the resist-coated block copolymer film comprises reactive ion etching using a tetrafluoromethane precursor. The nanopatterned substrate can be separated from the etch-resistant layer and the block copolymer film. This separation step can, for example, comprise contacting the etched article with a solution capable of dissolving or solubilizing the etch-resistant layer. For example, when the etch-resistant layer comprises gold, suitable solutions include aqueous solutions comprising potassium iodide and iodine, and aqueous solutions comprising cyanide ion. In some embodiments, the separation step comprises using a so-called lift-off method to swell the block copolymer layer and separate it and the overlying etch-resistant layer from the substrate. Solvents suitable for use in a lift-off method include any solvent or solvent mixture capable of swelling the block copolymer. For example, when the block copolymer is a polystyrene-poly(4-vinylpyridine) diblock copolymer, suitable solvents include toluene, tetrahydrofuran, chloroform, dimethylformamide, dimethylacetamide, and the like, and mixtures thereof. The lift-off method can, optionally, comprise agitation or sonication to facilitate separation of the swollen block copolymer layer from the substrate. In some embodiments, separating the etch-resistant layer and the block copolymer film from the nanopatterned substrate comprises contacting the etched article with an aqueous solution comprising potassium iodide and iodine.

Figure 2:
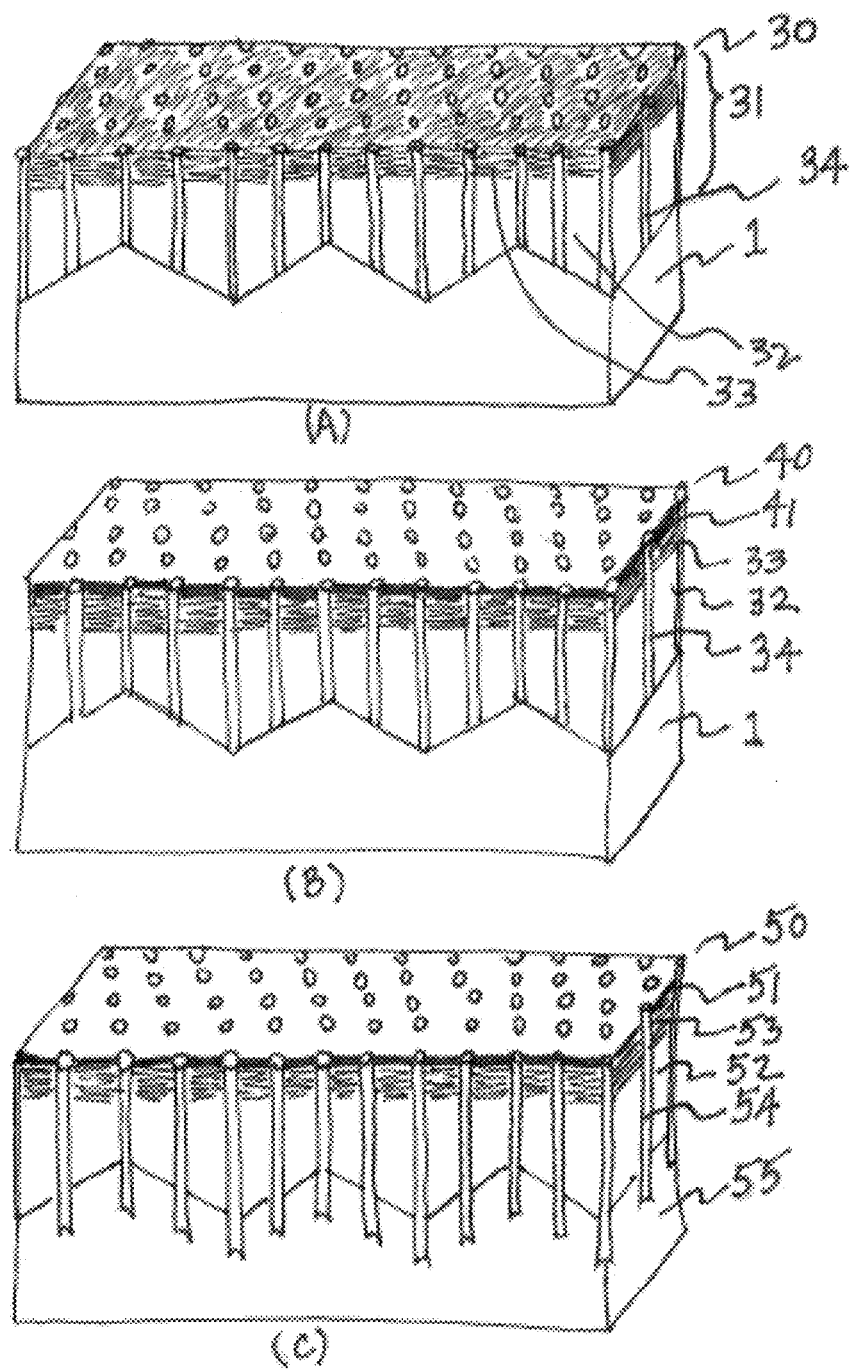
FIG. 2 is a schematic illustration of articles associated with a method for forming a nanopatterned substrate.

FIG. 2 is a schematic illustration of articles associated with a method of producing nanopatterned substrate. FIG. 2(A), which is equivalent to FIG. 1(D), shows a solvent-reconstructed, annealed block copolymer film-coated substrate 30. The solvent-reconstructed, annealed block copolymer film-coated substrate 30 comprises crystalline substrate 1, and solvent-reconstructed block copolymer film 31. The solvent-reconstructed block copolymer film 31 comprises major block layer 32 disposed on the annealed miscut surface 2 of the crystalline substrate 1 and composed primarily of the major component of the block copolymer. The solvent-reconstructed block copolymer film 31 further comprises a minor block layer 33, disposed on a surface of the major block layer opposite the annealed miscut surface 2 and composed primarily of the minor component of the block copolymer. The major block layer 32 and the minor block layer 33 collectively define an array of cylindrical voids 34, corresponding to spaces remaining when the minor phase of the block copolymer was transferred from the annealed cylindrical domains 23 to the top surface of the block copolymer film. Coating an etch resist layer from a glancing angle onto solvent-reconstructed, annealed block copolymer film-coated substrate 30 produces resist-coated, solvent-reconstructed, annealed block copolymer film-coated substrate 40, which is shown in FIG. 2(B). This layered structure comprises etch resist layer 41, and substrate 1, major block layer 32, minor block layer 33, and voids 34. Etching the resist-coated, solvent-reconstructed, annealed block copolymer film-coated substrate 40 produces etched, resist-coated, solvent-reconstructed, annealed block copolymer film-coated substrate 50, which is shown in FIG. 2(C). This layered structure comprises etched etch-resist layer 51, etched major block layer 32, etched minor block layer 53, etched voids 54, and etched substrate 55. Although the etch resistant layer 41 largely protects from etching the major block layer 32, minor block layer 33, and voids 34, some etching of these features can occur in the etching step, hence they are renumbered in FIG. 2(C) and renamed with the modifier "etched".

Another use of the method is to prepare arrays of magnetic materials on a substrate. For example, when the surface-reconstructed block copolymer film defines a hexagonal array of cylindrical voids extending (perpendicular to and) through the surface-reconstructed block copolymer film, a magnetic material can be coated onto and from directly above the surface reconstructed block copolymer film so that it at least partially fills the voids defined by the surface reconstructed block copolymer film. Suitable magnetic materials include, for example, nickel, cobalt, chromium, and alloys of iron and platinum. Once the magnetic material has been coated, the magnetically decorated substrate can be separated from the block copolymer film using, for example, a lift-off method.

In a very specific embodiment of the method, the crystalline substrate consists essentially of a single crystal of crystalline aluminum oxide or doped silicon; the block copolymer film comprises a polystyrene-block-poly(4-vinylpyridine) diblock copolymer comprising a polystyrene block having a number average molecular weight of about 6,000 to about 30,000 atomic mass units and a poly(4-vinylpyridine) or poly(2-vinylpyridine) block having a number average molecular weight of about 2,000 to about 10,000 atomic mass units; a ratio of the number average molecular weight of the polystyrene block to the number average molecular weight of the poly(4-vinylpyridine) or poly(2-vinylpyridine) block is about 2 to about 6; the annealing the block copolymer film comprises exposing the block copolymer film to an annealing solvent vapor comprising toluene and tetrahydrofuran; the annealed block copolymer film comprises a hexagonal array of cylindrical poly(4-vinylpyridine) or poly(2-vinylpyridine) microdomains; the hexagonal array of cylindrical microdomains exhibits an orientation order of at least 0.9 over an area of at least 1 centimeter$^2$; and wherein the surface reconstructing the annealed block copolymer film comprises immersing the annealed block copolymer film in a solvent comprising a $C_1$-$C_3$ alkanol. In some embodiments, the method further comprises coating a gold layer on the surface reconstructed block copolymer film; wherein the gold layer has a thickness of about 0.5 to about 2 nanometers.

In another very specific embodiment of the method, the crystalline substrate consists essentially of a single crystal of crystalline aluminum oxide or doped silicon; the block copolymer film comprises a polystyrene-block-poly(ethylene oxide) diblock copolymer comprising a polystyrene block having a number average molecular weight of about 6,000 to about 30,000 atomic mass units and a poly(ethylene oxide) block having a number average molecular weight of about 2,000 to about 10,000 atomic mass units; a ratio of the number average molecular weight of the polystyrene block to the number average molecular weight of the poly(ethylene oxide) block is about 2 to about 6; the annealing the block copolymer film comprises exposing the block copolymer film to an annealing solvent vapor comprising toluene and tetrahydrofuran; the annealed block copolymer film comprises a hexagonal array of cylindrical poly(ethylene oxide) microdomains; the hexagonal array of cylindrical microdomains exhibits an orientation order of at least 0.9 over an area of at least 1 centimeter$^2$; and wherein the surface reconstructing the annealed block copolymer film comprises immersing the annealed block copolymer film in a solvent comprising a $C_1$-$C_3$ alkanol. In some embodiments, the method further comprises coating a gold layer on the surface reconstructed block copolymer film; wherein the gold layer has a thickness of about 0.5 to about 2 nanometers.

The invention includes layered articles prepared by the above-described methods. The method's ability to generate highly ordered arrays over large areas permits the fabrication of memory devices. For example, the memory devices can be fabricated by a method comprising depositing magnetic material in the voids formed by surface reconstruction of an annealed block copolymer film comprising a hexagonal array of cylindrical domains. Due to the small separations of microdomains in the annealed block copolymer films, the memory device can have a very high storage density. For example, in some embodiments, the memory device has an areal storage density of about $1 \times 10^{10}$ to about $1.5 \times 10^{12}$ bits per square centimeter. In addition to their use in the fabrication of memory devices, the long-range lateral order of the nanopatterned articles makes them useful for applications such as polarizers (for background, see V. Pelletier, K. Asakawa, M. Wu, D. H. Adamson, R. A. Register, and P. M. Chaiken, *Applied Physics Letters,* 2006, volume 88, page 211114 ff.), templates for pattern transfer to generate microelectronic integrated circuits (for background, see C. T. Black, *IEEE Transactions on Nanotechnology,* 2004, volume 3, page 412 ff.), magnetic media (for background, see, for example, C. A. Ross, *Annual Review of Materials Research,* 2001, volume 31, page 203 ff.), and optical waveguides (for background, see C. A. Ross, *Annual Reviews of Materials Research,* 2001, volume 31, page 203 ff.; and S. A. Maier, M. L. Brongersma, P. G. Kik, S. Meltzer, A. A. G. Requicha, and H. A. Atwater, *Advanced Materials,* 2001, volume 13, page 1501 ff.).

One embodiment is a layered article, comprising: a crystalline substrate comprising an annealed, miscut surface; and a block copolymer film disposed on the annealed, miscut surface; wherein the block copolymer film comprises a block copolymer comprising a first block and a second block; wherein the block copolymer film comprises a major block layer contacting the annealed, miscut surface, and comprising at least 65 weight percent, specifically 65 to 85 weight percent, of the first block, and a minor block layer contacting the major block layer (and opposite from the substrate), and comprising at least 80 weight percent of the second block; and wherein the block copolymer film defines a hexagonal array of cylindrical voids extending (perpendicular to and) through the major block layer and the minor block layer. Such a layered article can be formed by a process comprising forming a block copolymer film on an annealed, miscut surface of a crystalline substrate; annealing the block copolymer film; and surface reconstructing the annealed block copolymer film. The layered article can, optionally, further comprise an etch resist layer disposed on the minor block layer of the block copolymer film (opposite the major block layer of the block copolymer film).

The invention includes at least the following embodiments.

Embodiment 1: A method of preparing a nanopatterned surface, comprising: forming a block copolymer film on an annealed, miscut surface of a crystalline substrate; annealing the block copolymer film; and surface reconstructing the annealed block copolymer film.

Embodiment 2: The method of embodiment 1, wherein the annealed block copolymer film comprises a hexagonal array of cylindrical microdomains.

Embodiment 3: The method of embodiment 2, wherein the hexagonal array of cylindrical microdomains exhibits an orientation order of at least 0.9 over an area of at least 1 centimeter$^2$.

Embodiment 4: The method of embodiment 2 or 3, wherein the cylindrical microdomains are separated by a nearest-neighbor distance of about 10 to about 100 nanometers.

Embodiment 5: The method of embodiment 1, wherein the annealed block copolymer film comprises a linear array of microdomains.

Embodiment 6: The method of any of embodiments 1-5, wherein the block copolymer comprises a first block having a first Hildebrand solubility parameter and a second block having a second Hildebrand solubility parameter, and wherein the first Hildebrand solubility parameter and the second Hildebrand solubility parameter differ by at least 0.4 megapascal$^{1/2}$.

Embodiment 7: The method of embodiment 6, wherein the first block and the second block differ in number average molecular weight by at least a factor of 1.5.

Embodiment 8: The method of any of embodiments 1-7, wherein the block copolymer is a polystyrene-poly(4-vinylpyridine) or polystyrene-poly(2-vinylpyridine) diblock copolymer.

Embodiment 9: The method of any of embodiments 1-7, wherein the block copolymer is a polystyrene-poly(ethylene oxide) diblock copolymer.

Embodiment 10: The method of any of embodiments 1-9, wherein the block copolymer film has a thickness of about 10 to about 100 nanometers.

Embodiment 11: The method of any of embodiments 1-10, wherein the crystalline substrate consists essentially of a single crystal.

Embodiment 12: The method of any of embodiments 1-11, wherein the crystalline substrate is selected from the group consisting of crystalline silicon, doped crystalline silicon, and crystalline aluminum oxide.

Embodiment 13: The method of any of embodiments 1-12, wherein the crystalline substrate comprises crystalline silicon.

Embodiment 14: The method of any of embodiments 1-12, wherein the crystalline substrate comprises crystalline aluminum oxide.

Embodiment 15: The method of any of embodiments 1-14, wherein the miscut crystalline surface is at least one degree removed from any crystallographic plane of the crystalline substrate.

Embodiment 16: The method of any of embodiments 1-15, wherein the annealed, miscut surface of the crystalline substrate exhibits a saw-tooth pattern characterized by a peak-to-peak separation of about 24 to about 200 nanometers and a peak-to-valley separation of about 3 to about 20 nanometers.

Embodiment 17: The method of any of embodiments 1-15, wherein the annealed, miscut surface of the crystalline substrate exhibits a grooved pattern characterized by a groove depth of about 3 to about 20 nanometers and a groove-to-groove separation of about 24 to about 200 nanometers.

Embodiment 18: The method of any of embodiments 1-17, wherein the annealed, miscut surface of the crystalline substrate is chemically homogeneous.

Embodiment 19: The method of any of embodiments 1-8, wherein the block copolymer is a polystyrene-poly(4-vinylpyridine) diblock copolymer, and wherein the surface reconstructing the annealed block copolymer film comprises immersing the block copolymer film in a lower alkanol solvent selected from the group consisting of methanol, ethanol, and mixtures thereof.

Embodiment 20: The method of any of embodiments 1-19, further comprising coating an etch-resistant layer on the surface reconstructed block copolymer film to form a resist-coated block copolymer film.

Embodiment 21: The method of embodiment 20, wherein the coating the etch-resistant layer on the surface reconstructed block copolymer film comprises depositing gold onto the surface reconstructed block copolymer film.

Embodiment 22: The method of embodiment 20 or 21, further comprising etching through the resist-coated block copolymer film and into the substrate to create an etched article comprising a nanopatterned substrate.

Embodiment 23: The method of embodiment 22, further comprising separating the etch-resistant layer and the block copolymer film from the nanopatterned substrate.

Embodiment 24: The method of embodiment 1, wherein the surface-reconstructed block copolymer film defines a hexagonal array of cylindrical voids extending through the surface-reconstructed block copolymer film; and wherein the method further comprises coating a magnetic material on the surface reconstructed block copolymer film and into the voids defined by the surface reconstructed block copolymer film.

Embodiment 25: The method of embodiment 24, wherein the magnetic material is selected from the group consisting of nickel, cobalt, chromium, and alloys of iron and platinum.

Embodiment 26: The method of embodiment 24 or 25, further comprising separating the magnetic material-coated, reconstructed block copolymer film from the crystalline substrate to form a miscut surface decorated with a hexagonal array of magnetic islands.

Embodiment 27: The method of embodiment 1, wherein the crystalline substrate consists essentially of a single crystal of crystalline aluminum oxide or doped silicon; wherein the block copolymer film comprises a polystyrene-block-poly(4-vinylpyridine) diblock copolymer comprising a polystyrene block having a number average molecular weight of about 6,000 to about 30,000 atomic mass units and a poly(4-vinylpyridine) or poly(2-vinylpyridine) block having a number average molecular weight of about 2,000 to about 10,000 atomic mass units; wherein a ratio of the number average molecular weight of the polystyrene block to the number average molecular weight of the poly(4-vinylpyridine) or poly(2-vinylpyridine) block is about 2 to about 6; wherein the annealing the block copolymer film comprises exposing the block copolymer film to an annealing solvent vapor comprising toluene and tetrahydrofuran; wherein the annealed block copolymer film comprises a hexagonal array of cylindrical poly(4-vinylpyridine) or poly(2-vinylpyridine) microdomains; wherein the hexagonal array of cylindrical microdomains exhibits an orientation order of at least 0.9 over an area of at least 1 centimeter$^2$; and wherein the surface reconstructing the annealed block copolymer film comprises immersing the annealed block copolymer film in a solvent comprising a $C_1$-$C_3$ alkanol.

Embodiment 28: The method of embodiment 1, wherein the crystalline substrate consists essentially of a single crystal of crystalline aluminum oxide or doped silicon; wherein the block copolymer film comprises a polystyrene-block-poly(ethylene oxide) diblock copolymer comprising a polystyrene block having a number average molecular weight of about 6,000 to about 30,000 atomic mass units and a poly(ethylene oxide) block having a number average molecular weight of about 2,000 to about 10,000 atomic mass units; wherein a ratio of the number average molecular weight of the polystyrene block to the number average molecular weight of the poly(ethylene oxide) block is about 2 to about 6; wherein the annealing the block copolymer film comprises exposing the block copolymer film to an annealing solvent vapor comprising toluene and tetrahydrofuran; wherein the annealed block copolymer film comprises a hexagonal array of cylindrical poly(ethylene oxide) microdomains; wherein the hexagonal array of cylindrical microdomains exhibits an orientation order of at least 0.9 over an area of at least 1 centimeter$^2$; and wherein the surface reconstructing the annealed block copolymer film comprises immersing the annealed block copolymer film in a solvent comprising a $C_1$-$C_3$ alkanol.

Embodiment 29: A layered article prepared by the process of embodiment 1.

Embodiment 30: The layered article of embodiment 29, wherein the layered article is a memory device.

Embodiment 31: The layered article of embodiment 30, wherein the memory device has an areal storage density of about $1 \times 10^{10}$ to about $1.5 \times 10^{12}$ bits per square centimeter.

Embodiment 32: A layered article, comprising: a crystalline substrate comprising an annealed, miscut surface; and a block copolymer film disposed on the annealed, miscut surface; wherein the block copolymer film comprises a block copolymer comprising a first block and a second block; wherein the block copolymer film comprises a major block layer contacting the annealed, miscut surface, and comprising at least 65 weight percent of the first block, and a minor block layer contacting the major block layer, and comprising at least 80 weight percent of the second block; and wherein the block copolymer film defines a hexagonal array of cylindrical voids extending through the major block layer and the minor block layer.

Embodiment 33: The layered article of embodiment 32, further comprising an etch resist layer disposed on the minor block layer of the block copolymer film.

The invention is further illustrated by the following non-limiting examples.

WORKING EXAMPLES

Preparation of miscut silicon substrate. The miscut silicon substrates were polished silicon wafers with the surface normal pointing 2 to 4 degrees off the <113> crystal axis toward the <001> axis. These miscut silicon substrates were obtained from University Wafer as miscut silicon wafers. Arsenic doped (n-type) silicon was used to enable resistive heating. The miscut silicon wafers were repeatedly heated under ultra-high vacuum conditions (that is, a pressure less than $1 \times 10^{-9}$ torr (0.13 micropascal)) by flowing a direct current through them. They were maintained at a temperature of 1535 K (1262° C.) for one minute, then rapidly cooled to 1300 K (1027° C.), then slowly cooled to room temperature and exposed to ambient conditions.

Figure 3:
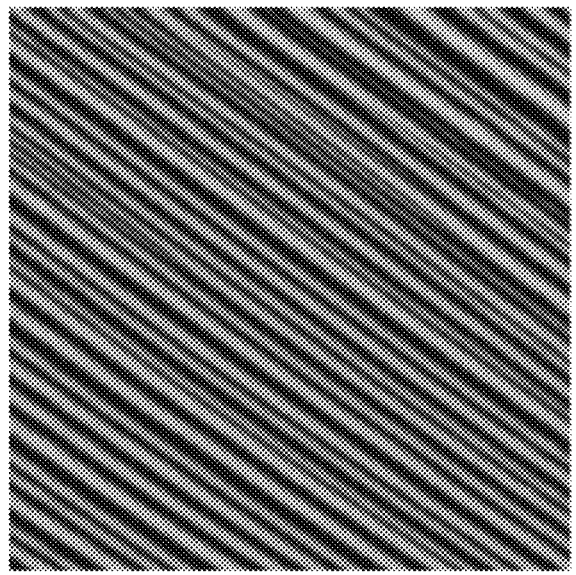
FIG. 3 is a scanning force microscope (SFM) image of a 5 micrometer×5 micrometer area of an annealed crystalline aluminum oxide substrate.

Preparation of miscut sapphire substrate. Miscut C-plane sapphire (miscut inclination angle of several degree towards the [1 $\bar{1}$00] direction) was annealed in air at 1373 K (1100° C.) for 10 hours. M-plane sapphire, which is not a miscut surface but is instead an unstable plane formed at temperatures over 1200° C., was formed by heating a sapphire wafer in air at 1300 to 1500° C. for 24 hours to form self-generated saw-tooth patterns. Typically, such annealed sapphire substrates exhibit a saw-tooth topography with a peak-to-valley separation of about 10 nanometers and average peak separation distance ranging from about 70 to about 200 nanometers. A scanning force microscope image of a 5 micrometer×5 micrometer area of an annealed sapphire substrate is presented as FIG. 3.

Development of block copolymer thin film onto grooved surface. Polystyrene-block-poly(ethylene oxide) (PS-b-PEO) was dissolved in benzene at room temperature, while polystyrene-block-poly(4-vinylpyridine) (PS-b-P4VP) diblock copolymers were dissolved in toluene/tetrahydrofuran solvent mixtures at 70° C. for 2 hours and cooled to room temperature. Block copolymer thin films were fabricated by spin-coating typically at 3,000 rotations per minute (rpm) and 60 seconds from a 0.7-1.0 weight percent solution onto the groove-patterned surface of a sapphire substrate that had previously been cleaned using oxygen plasma. Cylindrical microdomains normal to the surface formed spontaneously after spin-coating. Annealing the resulting films with solvent vapor produced an array of cylindrical microdomains with a high degree of lateral order Solvent annealing of PS-b-PEO was performed in water vapor for 1 hour, followed by benzene/water vapor environment for 4 hours at room temperature. In contrast, PS-b-P4VP was annealed in the vapor of a toluene/tetrahydrofuran solvent mixture (toluene: tetrahydrofuran volume/volume ratio about 20:80 to about 80:20) for 10 hours at room temperature. After solvent annealing of PS-b-PEO and PS-b-P4VP, the orientational order of cylindrical microdomains is typically over 0.90.

Figure 4:
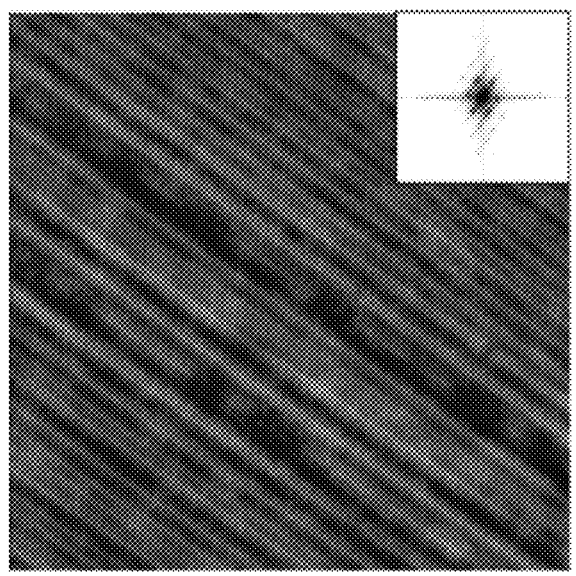
FIG. 4. is an SFM image of a 4 micrometer×4 micrometer area of a polystyrene-block poly(ethylene oxide) (PS-b-PEO) block copolymer thin film annealed in solvent vapor on a thermally annealed crystalline aluminum oxide (sapphire) substrate; the polystyrene block number average molecular weight was about 20,000 atomic mass units, and the poly (ethylene oxide) block number average molecular weight was about 6,500 atomic mass units; the inset is a Fourier transform image of the cylindrical microdomains.

Surface reconstruction of solvent annealed films was conducted by dipping the films into methanol or ethanol for 20 minutes, followed by drying in a nitrogen atmosphere. This surface reconstruction process that moves PEO or P4VP from the cylindrical domains to the surface of the film, creating nanopores in the block copolymer film FIG. 4 shows an SFM image of a polystyrene-block-poly(ethylene oxide) (PS-b-PEO; number average molecular weight of PS block is about 20,000 atomic mass units; number average molecular weight of poly(ethylene oxide) is about 6,500 atomic mass units) block copolymer thin film annealed in benzene/water vapor on a saw-tooth-patterned annealed sapphire substrate. The saw-tooth pattern of the sapphire substrate guides the long-range order of cylindrical microdomains oriented normal to the film surface. Highly ordered microdomains are shown in the SFM image, and the Fourier transform pattern (FIG. 4 inset) shows multiple order scattering spots, which are characteristic of long-range order. From image analysis, an average cylindrical microdomain diameter of about 27 nanometers and an average center-to-center distance of about 56 nanometers were calculated.

Figure 5:
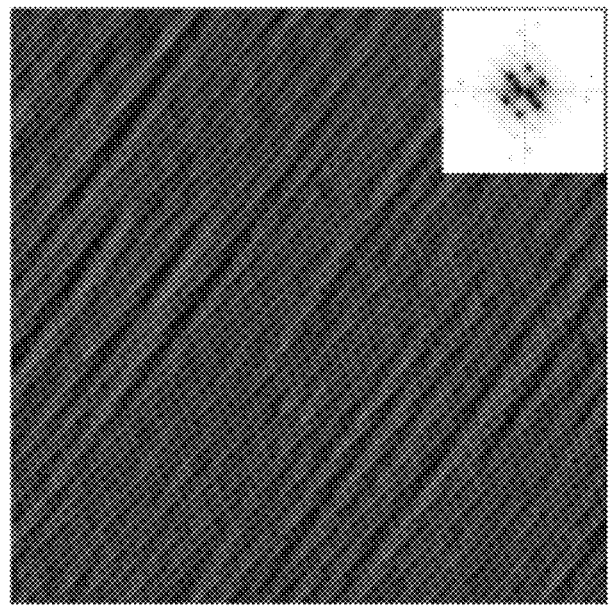
FIG. 5. is an SFM image of a 2 micrometer×2 micrometer area of a PS-b-PEO thin film annealed in solvent vapor on a thermally annealed crystalline aluminum oxide (sapphire) substrate; the polystyrene block number average molecular weight was about 16,000 atomic mass units, and the poly (ethylene oxide) block number average molecular weight was about 3,500 atomic mass units; the inset is a Fourier transform image of the cylindrical microdomains.

To decrease the feature size and center-to-center distance of cylindrical microdomains, a smaller molecular weight of PS-b-PEO block copolymer was used. The polystyrene block had a number average molecular weight of about 16,000 atomic mass units, and the poly(ethylene oxide) block had a number average molecular weight of about 3,500 atomic mass units. Highly ordered cylindrical microdomains oriented normal to the surface are shown in FIG. 5. The smaller molecular weight PS-b-PEO system was developed at slightly different annealing condition comparing with the higher molecular weight PS-b-PEO. Higher molecular weight PS-b-PEO was annealed in benzene/water vapor for 4 hours, while lower molecular weight PS-b-PEO was annealed for 3 hours. Even though use of lower molecular weight PS-b-PEO led to the formation of smaller microdomains, their long range order was guided by the saw-tooth-patterned annealed sapphire surface. From image analysis, an average cylindrical microdomain diameter of about 16 nanometers, and an average center-to-center distance of about 30 nanometers were calculated.

Figure 6:
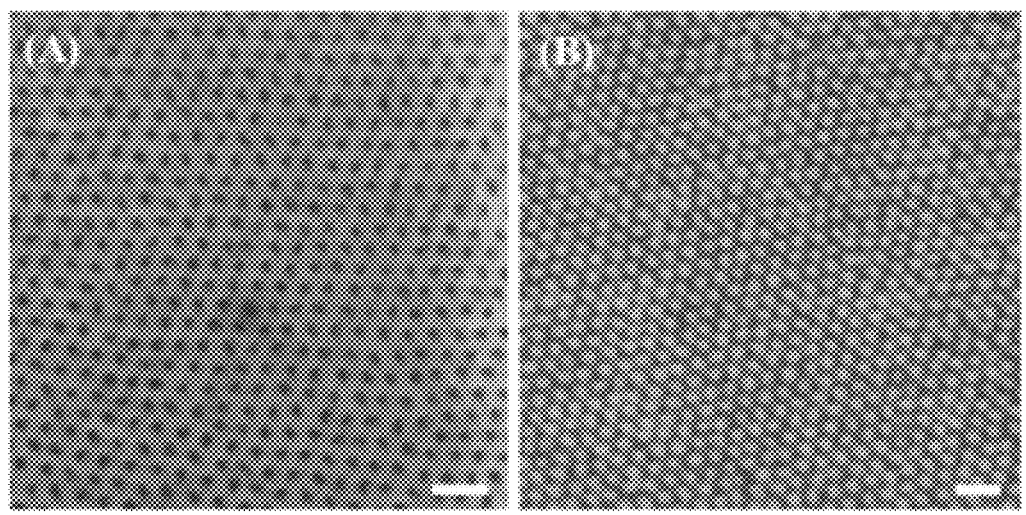
FIG. 6 shows silicon oxide surface with nano-sized pores (A), and nano-sized pillars (B).

Gold decoration and reactive ion etching of block copolymer thin films. To transfer the pattern produced by the gold coated polymer films into the underlying substrate, the films were etched using reactive ion etching (RIE) under $SF_6$ atmosphere (TRION technology, at 50 millitorr pressure, 25 standard cubic centimeter per minute flow rate, and 40 watts power). After etching into the silicon oxide, the gold coated films were removed with a 10 wt % $KI/I_2$ (4/1, volume/volume) solution, followed by oxygen plasma etching for 10 minutes. FIG. 6 shows transferred patterns of three gold decorated polymer templates into silicon oxide using $SF_6$ RIE with high fidelity. It should be noted that the metal coated films can be used as hard etching masks for pattern transfer into the underlying substrate. Etching can be either positive or negative. FIG. 6(A) shows a silicon oxide surface with nano-sized pores, and FIG. 6(B) shows a silicon oxide surface with nano-sized pillars. The scale bar in each image is 100 nanometers.

Figure 7:
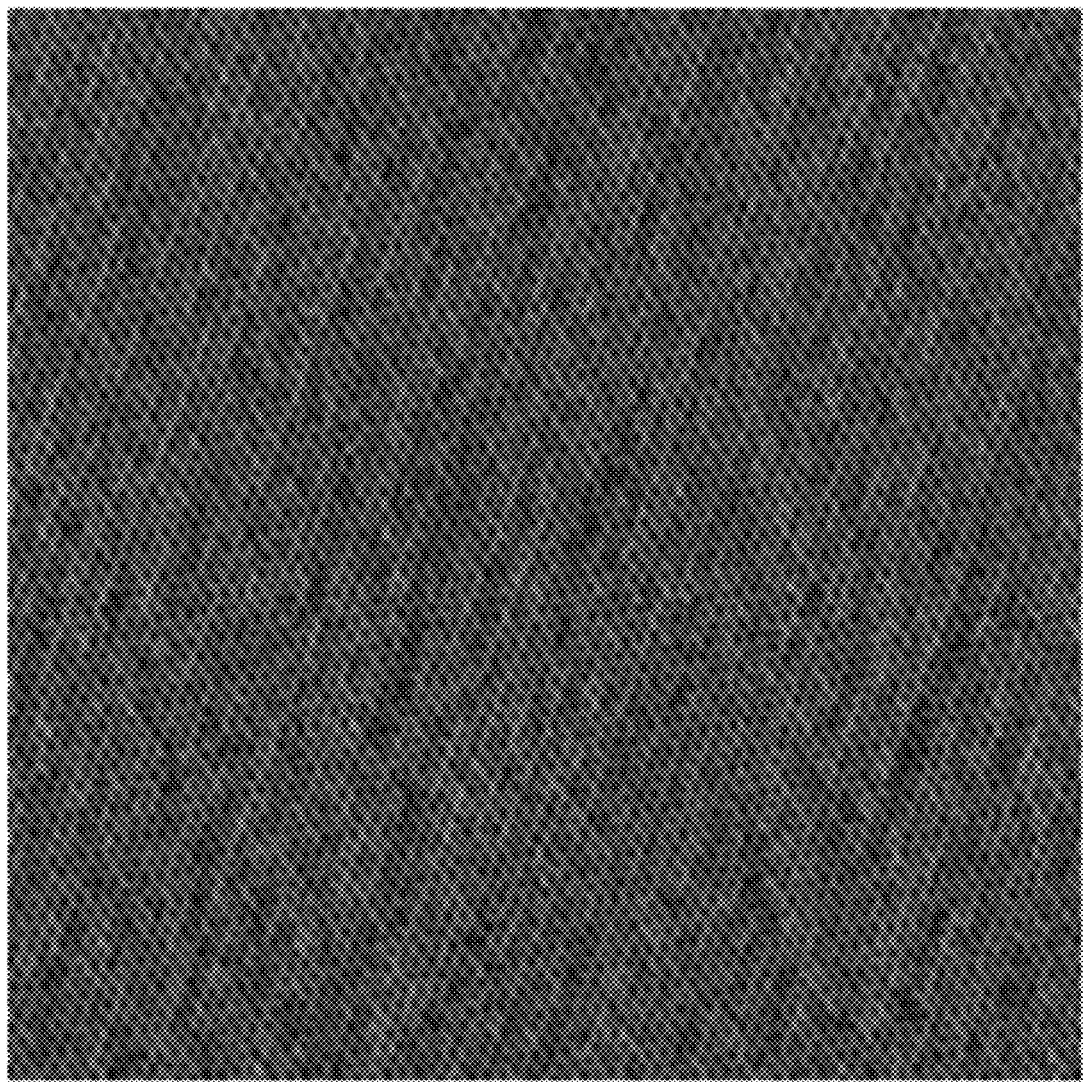
FIG. 7 shows an annealed polystyrene-block-poly(ethylene oxide) film on a miscut sapphire substrate; the film was annealed in xylene vapor for 2 hours at room temperature.

To get much higher areal density of cylindrical microdomains, polystyrene-block-poly(ethylene oxide) (molecular weights of polystyrene and poly(ethylene oxide) are 16,000 and 5,000 atomic mass units, respectively) thin films were annealed in xylene vapor for 2 hours at room temperature. Highly ordered cylindrical microdomains having an average separation distance of about 20.9 nanometers and a circular domain size of about 7.8 nanometers, corresponding to an areal density of about 0.38 terabit per square centimeter, can be seen in FIG. 7. FIG. 7 shows annealed (but not solvent reconstructed) polystyrene-block-poly(ethylene oxide) films on annealed, miscut sapphire substrates. The substrate used to generate FIG. 7 was annealed in xylene vapor for 2 hours at room temperature.

Figure 8:
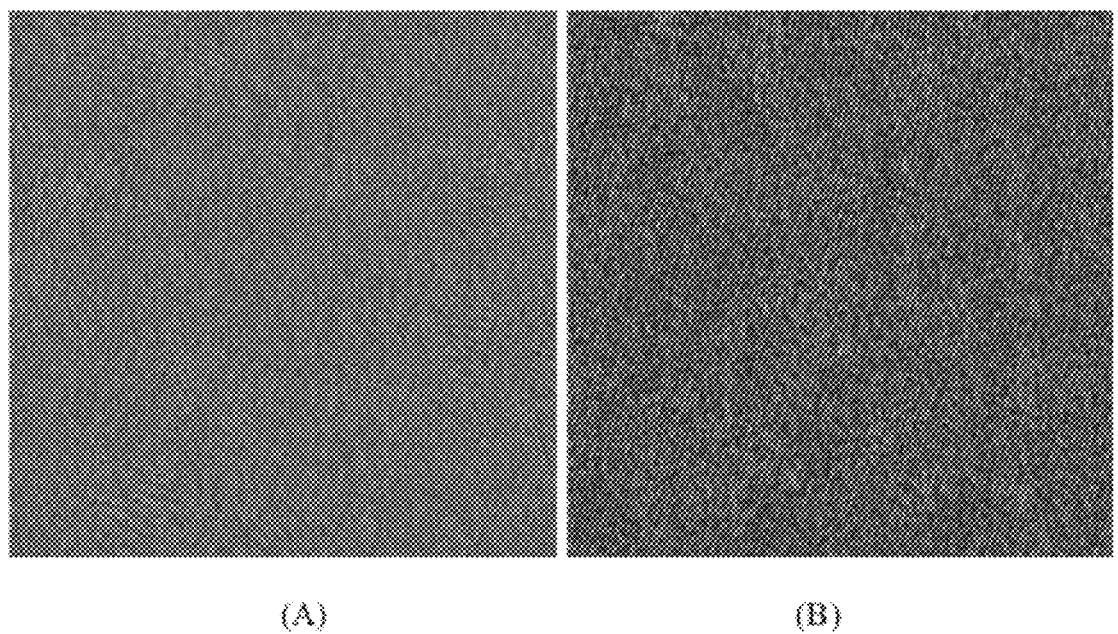
FIG. 8 shows Moiré patterns on annealed polystyrene-block-poly(ethylene oxide) films on flat M-plane sapphire (FIG. 8(A); unpatterned surface) and miscut sapphire (FIG. 8(B); patterned surface) substrates.

Comparison of block copolymer films on unpatterned and patterned sapphire substrates. To characterize the grain size and orientation of PEO cylindrical microdomains, the Moiré interference pattern analysis was used. Long-range order is shown in larger area (25 micrometer×25 micrometer) Moiré interference patterns. When the same PS-b-PEO thin films are developed at the same annealing condition onto flat sapphire substrate, multi-grain, a number of defects and dislocation were observed from the Moiré interference pattern as shown in FIG. 8. FIG. 8 shows Moiré patterns on annealed (but not solvent reconstructed) polystyrene-block-poly(ethylene oxide) films on flat M-plane sapphire (FIG. 8(A); unpatterned surface) and miscut sapphire (FIG. 8(B); patterned surface) substrates.

Figure 9:
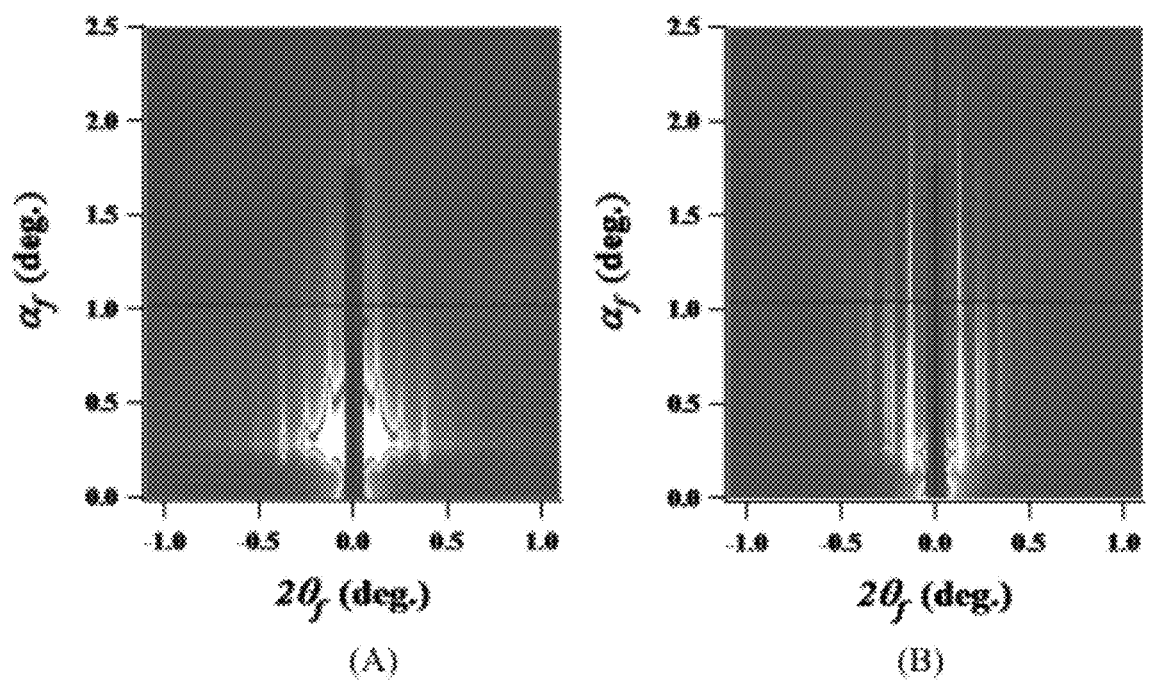
FIG. 9 shows two dimensional GISAXS patterns of PS-b-PEO thin films.

Characterization of Block Copolymer Films by Grazing Incidence Small-Angle X-ray Scattering. To characterize the nanostructures of block copolymer over a larger area, we employed grazing incidence small-angle X-ray scattering (GISAXS). GISAXS was used to investigate the morphology of the PS-b-PEO and its orientation within the samples. FIG. 9 shows two dimensional GISAXS patterns of PS-b-PEO thin films FIG. 9(A) represents the hexagonal cylinder viewed from the direction of cylindrical axes, the (10) symmetric plane. GISAXS patterns of cylindrical microdomains show only integer diffraction peaks from (10) symmetric plane. As shown in FIG. 9(B), when the sample stage is rotated to 30 degrees from the (01) symmetric plane, diffraction peaks from (10), (11), (20), (21), (30), and (22) symmetric plane appeared. Depending upon whether the lattice of cylindrical microdomains is matched with the (10) symmetric plane, integer or hexagonal diffraction peaks were seen. These results demonstrate that saw-tooth patterns in miscut crystalline substrates can guide the PS-b-PEO cylindrical microdomains over at least a 1.5 centimeter×1.5 centimeter area, creating nearly perfect registry of the domains over that area.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A method of preparing a nanopatterned surface, comprising:
    forming a block copolymer film on an annealed, miscut surface of a crystalline substrate;
    annealing the block copolymer film; and
    surface reconstructing the annealed block copolymer film.

2. The method of claim 1, wherein the annealed block copolymer film comprises a hexagonal array of cylindrical microdomains.

3. The method of claim 2, wherein the hexagonal array of cylindrical microdomains exhibits an orientation order of at least 0.9 over an area of at least 1 centimeter.

4. The method of claim 2, wherein the cylindrical microdomains are separated by a nearest-neighbor distance of about 10 to about 100 nanometers.

5. The method of claim 1, wherein the annealed block copolymer film comprises a linear array of micro domains.

6. The method of claim 1, wherein the block copolymer comprises a first block having a first Hildebrand solubility parameter and a second block having a second Hildebrand solubility parameter, and wherein the first Hildebrand solubility parameter and the second Hildebrand solubility parameter differ by at least 0.4 megapascal$^{1/2}$.

7. The method of claim 6, wherein the first block and the second block differ in number average molecular weight by at least a factor of 1.5.

8. The method of claim 1, wherein the block copolymer is a polystyrene-poly(4-vinylpyridine) or polystyrene-poly(2-vinylpyridine) diblock copolymer.

9. The method of claim 1, wherein the block copolymer is a polystyrene-poly(ethylene oxide) diblock copolymer.

10. The method of claim 1, wherein the block copolymer film has a thickness of about 10 to about 100 nanometers.

11. The method of claim 1, wherein the crystalline substrate consists essentially of a single crystal.

12. The method of claim 1, wherein the crystalline substrate is selected from the group consisting of crystalline silicon, doped crystalline silicon, and crystalline aluminum oxide.

13. The method of claim 1, wherein the crystalline substrate comprises crystalline silicon.

14. The method of claim 1, wherein the crystalline substrate comprises crystalline aluminum oxide.

15. The method of claim 1, wherein the miscut crystalline surface is at least one degree removed from any crystallographic plane of the crystalline substrate.

16. The method of claim 1, wherein the annealed, miscut surface of the crystalline substrate exhibits a saw-tooth pattern characterized by a peak-to-peak separation of about 24 to about 200 nanometers and a peak-to-valley separation of about 3 to about 20 nanometers.

17. The method of claim 1, wherein the annealed, miscut surface of the crystalline substrate exhibits a grooved pattern characterized by a groove depth of about 3 to about 20 nanometers and a groove-to-groove separation of about 24 to about 200 nanometers.

18. The method of claim 1, wherein the annealed, miscut surface of the crystalline substrate is chemically homogeneous.

19. The method of claim 1, wherein the block copolymer is a polystyrene-poly(4-vinylpyridine) diblock copolymer, and wherein the surface reconstructing the annealed block copolymer film comprises immersing the block copolymer film in a lower alkanol solvent selected from the group consisting of methanol, ethanol, and mixtures thereof.

20. The method of claim 1, further comprising coating an etch-resistant layer on the surface reconstructed block copolymer film to form a resist-coated block copolymer film.

21. The method of claim 20, wherein the coating the etch-resistant layer on the surface reconstructed block copolymer film comprises depositing gold onto the surface reconstructed block copolymer film.

22. The method of claim 20, further comprising etching through the resist-coated block copolymer film and into the substrate to create an etched article comprising a nanopatterned substrate.

23. The method of claim 22, further comprising separating the etch-resistant layer and the block copolymer film from the nanopatterned substrate.

24. The method of claim 1,
wherein the surface-reconstructed block copolymer film defines a hexagonal array of cylindrical voids extending through the surface-reconstructed block copolymer film; and
wherein the method further comprises coating a magnetic material on the surface reconstructed block copolymer film and into the voids defined by the surface reconstructed block copolymer film.

25. The method of claim 24, wherein the magnetic material is selected from the group consisting of nickel, cobalt, chromium, and alloys of iron and platinum.

26. The method of claim 24, further comprising separating the magnetic material-coated, reconstructed block copolymer film from the crystalline substrate to form a miscut surface decorated with a hexagonal array of magnetic islands.

27. The method of claim 1,
wherein the crystalline substrate consists essentially of a single crystal of crystalline aluminum oxide or doped silicon;
wherein the block copolymer film comprises a polystyrene-block-poly(4-vinylpyridine) diblock copolymer comprising a polystyrene block having a number average molecular weight of about 6,000 to about 30,000 atomic mass units and a poly(4-vinylpyridine) or poly(2-vinylpyridine) block having a number average molecular weight of about 2,000 to about 10,000 atomic mass units;
wherein a ratio of the number average molecular weight of the polystyrene block to the number average molecular weight of the poly(4-vinylpyridine) or poly(2-vinylpyridine) block is about 2 to about 6;
wherein the annealing the block copolymer film comprises exposing the block copolymer film to an annealing solvent vapor comprising toluene and tetrahydrofuran;
wherein the annealed block copolymer film comprises a hexagonal array of cylindrical poly(4-vinylpyridine) or poly(2-vinylpyridine) microdomains;
wherein the hexagonal array of cylindrical microdomains exhibits an orientation order of at least 0.9 over an area of at least 1 centimeter$^2$; and
wherein the surface reconstructing the annealed block copolymer film comprises immersing the annealed block copolymer film in a solvent comprising a $C_1$-$C_3$ alkanol.

28. The method of claim 1,
wherein the crystalline substrate consists essentially of a single crystal of crystalline aluminum oxide or doped silicon;
wherein the block copolymer film comprises a polystyrene-block-poly(ethylene oxide) diblock copolymer comprising a polystyrene block having a number average molecular weight of about 6,000 to about 30,000 atomic mass units and a poly(ethylene oxide) block having a number average molecular weight of about 2,000 to about 10,000 atomic mass units;
wherein a ratio of the number average molecular weight of the polystyrene block to the number average molecular weight of the poly(ethylene oxide) block is about 2 to about 6;

wherein the annealing the block copolymer film comprises exposing the block copolymer film to an annealing solvent vapor comprising toluene and tetrahydrofuran;

wherein the annealed block copolymer film comprises a hexagonal array of cylindrical poly(ethylene oxide) microdomains;

wherein the hexagonal array of cylindrical microdomains exhibits an orientation order of at least 0.9 over an area of at least 1 centimeter; and wherein the surface reconstructing the annealed block copolymer film comprises immersing the annealed block copolymer film in a solvent comprising a $C_1$-$C_3$ alkanol.

29. The method of claim 1, wherein the surface reconstructing the annealed block copolymer film comprises exposing the annealed block copolymer film to a solvent that preferentially dissolves a minor phase of the block copolymer film and effects transfer of the minor phase to a surface of the block copolymer film opposite the substrate.

* * * * *